US008054143B2

(12) United States Patent
Takahashi

(10) Patent No.: US 8,054,143 B2
(45) Date of Patent: Nov. 8, 2011

(54) SWITCH CIRCUIT AND SEMICONDUCTOR DEVICE

(75) Inventor: Yuji Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 227 days.

(21) Appl. No.: 12/447,521

(22) PCT Filed: Aug. 8, 2008

(86) PCT No.: PCT/JP2008/064321
§ 371 (c)(1),
(2), (4) Date: Apr. 28, 2009

(87) PCT Pub. No.: WO2009/022654
PCT Pub. Date: Feb. 19, 2009

(65) Prior Publication Data

US 2010/0060377 A1 Mar. 11, 2010

(30) Foreign Application Priority Data

Aug. 16, 2007 (JP) ................................ 2007-212262

(51) Int. Cl.
*H01P 1/10* (2006.01)
*H03K 17/693* (2006.01)

(52) U.S. Cl. ....................................... 333/103; 327/427

(58) Field of Classification Search .................. 333/101, 333/103, 104; 327/415, 416, 419, 427
See application file for complete search history.

(56) References Cited

U.S. PATENT DOCUMENTS 7,138,846 B2 * 11/2006 Suwa et al. .................. 327/308

FOREIGN PATENT DOCUMENTS

| | | | |
|---|---|---|---|
| JP | 1996307232 | A | 11/1996 |
| JP | 1997008621 | A | 1/1997 |
| JP | 1997018315 | A | 1/1997 |
| JP | 2000223902 | A | 8/2000 |
| JP | 2003188695 | A | 7/2003 |
| JP | 2005065060 | A | 3/2005 |
| JP | 2005072993 | A | 3/2005 |
| JP | 2005086420 | A | 3/2005 |
| JP | 2005323030 | A | 11/2005 |
| JP | 2005341485 | A | 12/2005 |
| JP | 2005341695 | A | 12/2005 |
| JP | 2006042138 | A | 2/2006 |
| JP | 3813869 | B | 6/2006 |
| JP | 2006211265 | A | 8/2006 |
| JP | 2006030775 | A | 11/2006 |
| JP | 2007073815 | A | 3/2007 |
| JP | 2007258766 | A | 10/2007 |
| JP | 2008017416 | A | 1/2008 |

OTHER PUBLICATIONS

International Search Report for PCT/JP2008/064321 mailed Sep. 16. 2008.

* cited by examiner

*Primary Examiner* — Dean Takaoka

(57) ABSTRACT

A switch circuit for passing or blocking a high-frequency signal includes a correction circuit for correcting an impedance component that exists in the switch circuit and that changes asymmetrically with the direct-current potential as a reference such that impedance as seen from either high-frequency terminal changes symmetrically with the direct-current potential as a reference in response to positive and negative changes that take the direct-current potential of the high-frequency signal as a reference.

28 Claims, 20 Drawing Sheets

-- RELATED ART --

-- RELATED ART --

SWITCH CIRCUIT AND SEMICONDUCTOR DEVICE

TECHNICAL FIELD

The present invention relates to a switch circuit for passing or blocking a high-frequency signal and to a semiconductor device provided with the switch circuit.

BACKGROUND ART

Conventionally, circuits that employ diodes or circuits that employ field-effect transistors (FETs) have been known as switch circuits for passing or blocking a high-frequency signal.

FIG. 1 shows a switch circuit of the background art that uses FETs, this FIG. 1 being a circuit diagram showing the configuration of a SPDT (Single-Pole Double-Through) switch circuit.

The SPDT switch circuit shown in FIG. 1 is provided with a first switch unit 21 and a second switch unit 22 of the SPST (Single-Pole Single-Through) for passing or blocking a high-frequency signal.

First switch unit 21 is connected between first high-frequency terminal 1 and second high-frequency terminal 2 that receive and supply a high-frequency signal, and second switch unit 22 is connected between first high-frequency terminal 1 and third high-frequency terminal 3 that receive and supply a high-frequency signal. First high-frequency terminal 1 is common to first switch unit 21 and second switch unit 22.

First switch unit 21 is of a configuration provided with a plurality of FETs connected in a series (in FIG. 1, three FETs 31-33), the two ends of this series being connected to high-frequency terminals 1 and 2, respectively. FETs 31-33 are connected in a series, the drain or source of one of FETs 31-33 being common to the source or drain of a neighboring one of FETs 31-33. The gate electrode of each of FETs 31-33 is connected to control terminal 11 by way of a respective one of resistance elements 41-43.

Similarly, second switch unit 22 is of a configuration provided with a plurality of FETs connected in a series (in FIG. 1, three FETs 34-36), each of the two ends of this series being connected to a respective one of high-frequency terminals 1 and 3. FETs 34-36 are connected in a series, the drain or source of one of FETs 34-36 being common to the source or drain of a neighboring one of FETs 34-36. The gate electrode of each of FETs 34-36 is connected to control terminal 12 by way of a respective one of resistance elements 44-46.

The gate electrodes of FETs 31-36 that are used in the switch circuit are typically formed with a large gate width, and a high resistance of several kΩ-several hundred kΩ is used in resistance elements 41-46 that are connected to the gate electrodes.

FIG. 2 is a plan view showing the configuration of an FET provided in the switch circuit shown in FIG. 1.

As shown in FIG. 2, the FET is of a configuration provided with drain 161, source 162, and gate electrode 151 formed on conductive channel 141. Resistance element 171 is connected to gate electrode 151 by way of through-hole 181.

When the FET shown in FIG. 2 is connected in a series as in the circuit shown in FIG. 1, source 162 should be common to the drain of the adjacent FET, and drain 161 should in turn be common to the source of the adjacent FET. In addition, resistance element 171 should be connected between the gate electrode of each FET and the control terminal (control terminals 11 and 12 shown in FIG. 1).

As described hereinabove, in an SPDT switch circuit, the gate width of each FET is formed large, resulting in an increase in parasitic capacitance and a deterioration of switch characteristics. Deterioration in characteristics is therefore suppressed in the configuration shown in FIG. 2 by arranging the gate electrode in a known meandering shape.

Explanation next regards the operation of the switch circuit of the background art shown in FIG. 1.

In the switch circuit shown in FIG. 1, the input of a high-level or a low-level control signal to control terminal 11 provided in first switch unit 21 and control terminal 12 provided in second switch unit 22 controls the ON/OFF of first switch unit 21 and second switch unit 22. If complementary input of high-level and low-level binary control signals is applied to control terminal 11 and control terminal 12 at this time, the high-frequency signal that was applied as input from first high-frequency terminal 1 can be supplied as output from second high-frequency terminal 2 or third high-frequency terminal 3, and one of the high-frequency signals applied as input from second high-frequency terminal 2 and third high-frequency terminal 3 can be supplied as output from first high-frequency terminal 1.

However, the properties demanded of a switch circuit such as shown in FIG. 1 include low transmission loss of the high-frequency signal and high isolation across high-frequency terminals. In addition to these properties, low nonlinear distortion is also crucial.

Nonlinear distortion generated in a switch circuit is present in the nonlinear characteristics provided by the various elements of a switch circuit. In particular, in a multiport switch circuit such as a one-input n- (where n is a positive integer) output SPnT switch circuit or an n-input m- (where m is a positive integer) output nPmT switch circuit, there are more signal paths in the OFF state than signal paths in the ON state, and the signal paths in the OFF state are therefore the chief source of nonlinear distortion. This nonlinear distortion is generated because the capacitance of the FET in the OFF state is greatly changed by the potential of the high-frequency signal applied to the FET. In particular, of the nonlinear distortion, even-order distortion such as secondary harmonic distortion ($2f_0$ distortion) or secondary intermodulation distortion (IMD2 distortion) is generated because the impedance when a positive potential is applied to an FET in the OFF state and impedance when a negative potential is applied change asymmetrically. The positive potential here described refers to a normal-direction potential with respect to a prescribed direct-current potential and the negative potential refers to a negative-direction potential with respect to the direct-current potential. This direct-current potential is not necessarily the ground potential.

In a FET in the OFF state, the gate-source capacitance (Cgs) and gate-drain capacitance (Cgd) each vary in response to the change in applied potential as shown in FIG. 3. This shows that the values of Cgs and Cgd also vary when the high-frequency signal applied from the high-frequency terminal changes in the normal direction and negative direction taking the direct-current potential as a reference. In the case of characteristics in which Cgd and Cgs do not intersect at the direct-current potential of the high-frequency signal due to, for example, divergence in the alignment of exposure at the time of fabrication of the FET, the impedance of the FET changes asymmetrically with the direct-current potential as a reference when a high-frequency signal is applied, and different voltage amplitudes are distributed across the gate-drain and across the gate-source, resulting in the occurrence of even-order distortion. Still further, when resistance elements are connected to the FET, the impedance of these elements also changes asymmetrically with the direct-current potential as a reference.

A FET in the OFF state can be considered equivalent to a capacitance element, and the above-described "asymmetrical change in impedance" can therefore be thought of as an asymmetrical change of the capacitance of the FET. However, in the switch circuit of the background art shown in FIG. 1, resistance elements 41-46 are connected to the gate electrodes of each of FETs 31-36 to prevent leakage of a signal from the gate electrode to the control terminal. Accordingly, the influence of the impedance of these resistance elements 41-46 cannot be ignored.

However, in the switch circuit of the background art, increasing the value of each of resistance elements 41-46 that are connected to the gate electrodes of the FETs allows the influence of the impedance of these elements to be ignored.

Japanese Patent Laid-Open No. 2005-341485 (hereinbelow referred to as Patent Document 1) discloses a configuration provided with two parallel signal paths for canceling the distortion component by inverting the phase of the distortion component of one signal path and then adding the distortion components of the two signal paths. In addition, Japanese Patent Laid-Open No. 2006-042138 (hereinbelow referred to as Patent Document 2) discloses a configuration for reducing the strength of the distortion component of a desired frequency by optimal setting of the length of the signal path, and Japanese Patent Laid-Open No. 2005-323030 (hereinbelow referred to as Patent Document 3) proposes a configuration for limiting the generation of distortion by stabilizing the voltage that is applied across the drain and source of an FET.

Still further, Japanese Patent Laid-Open No. 2000-223902 (hereinbelow referred to as Patent Document 4), Japanese Patent Laid-Open No. 2005-065060 (hereinbelow referred to as Patent Document 5), Japanese Patent Laid-Open No. 2005-072993 (hereinbelow referred to as Patent Document 6), Japanese Patent Laid-Open No. 2005-086420 (hereinbelow referred to as Patent Document 7), Japanese Patent Laid-Open No. 2006-211265 (hereinbelow referred to as Patent Document 8), Japanese Patent Laid-Open No. 2007-073815 (hereinbelow referred to as Patent Document 9), and Japanese Patent Laid-Open No. 2007-258766 (hereinbelow referred to as Patent Document 10) disclose configurations in which a capacitance element or resistance element is connected across the gate and drain or the gate and source of an FET to decrease loss or distortion of a switch circuit.

Japanese Patent Laid-Open No. 2006-211265 (hereinbelow referred to as Patent Document 11) discloses a configuration in which, based on the premise that reducing distortion necessitates the suppression of variation of Vgs of an FET, a circuit composed of FETs, resistance elements and capacitance elements is connected between the high-frequency terminal and gate electrode of an FET.

Japanese Patent Laid-Open No. 08-307232 (hereinbelow referred to as Patent Document 12) and Japanese Patent Laid-Open No. 09-018315 (hereinbelow referred to as Patent Document 13) disclose configurations for broadening the power range of a high-frequency signal that normally operates without saturation; and Japanese Patent No. 003813869 (hereinbelow referred to as Patent Document 14) discloses the reduction of distortion by correcting the asymmetry of capacitance.

Japanese Patent Laid-Open No. 2008-017416 (hereinbelow referred to as Patent Document 15) discloses a configuration that realizes the reduction of transmission loss of a high-frequency signal, the improvement of isolation properties between high-frequency terminals, and the reduction of distortion by turning ON/OFF the connection of a resistance element inserted between a control terminal and the gate electrode of an FET to change the resistance.

Of the switch circuits of the above-described background art, the configuration disclosed in Patent Document 1 requires the provision of a plurality of signal paths (wiring), and therefore suffers from the drawback of increased layout area. The configuration disclosed in Patent Document 1 suffers from the additional problem that the distortion component of frequencies close to that of the input signal cannot be eliminated.

The configuration disclosed in Patent Document 2 enables reduction of distortion of a desired frequency, but because the distortion component occurs at only one frequency, cannot be applied to the reduction of distortion components that occur at a plurality of frequencies.

The configuration disclosed in Patent Document 3 stabilizes switch operation by stabilizing the voltage applied across the drain and source of an FET. However, the effect of limiting even-order distortion cannot be obtained by the configuration disclosed in Patent Document 3.

The configurations disclosed in Patent Documents 4, 5, 6, 7, 8, 9, and 10 broaden the power range of a high-frequency signal that normally operates without saturation and can thus reduce the distortion that occurs when a high-power high-frequency signal is applied as input. In other words, the configurations disclosed in Patent Documents 4 to 10 are not intended for the reduction of distortion that occurs when a high-frequency signal is applied as input at power that is within normal operating range without saturation. In addition, the configurations disclosed in Patent Documents 4 to 10 sometimes exhibit even greater distortion due to the addition of resistance elements and capacitance elements in the direction in which the impedance, as seen from a high-frequency terminal, changes asymmetrically with the direct-current potential as reference.

The configurations disclosed in the above-described Patent Documents 1 to 10 do not eliminate the generation source of distortion itself and are therefore prone to problems such as a limited amount of reduction of distortion or the deterioration of other characteristics.

The configuration disclosed in Patent Document 11 suppresses variation of Vgs to suppress variation of the capacitance of an FET resulting from change in the bias voltage, but the effect of reducing distortion is insufficient because variation of not only the Vgs but also the Vgd must be suppressed in order to suppress variation of the capacitance of an FET.

The configurations disclosed in Patent Documents 12 and 13 are directed to broadening the power range of a high-frequency signal that normally operates without saturation and is not intended for reducing distortion that occurs when a high-frequency signal is applied as input at power within a normal operating range and that is not saturated.

Patent Document 14 describes the correction of the asymmetry of capacitance to reduce distortion but makes no disclosure regarding the generation source of distortion and therefore does not adequately describe how capacitance can be made symmetrical. In addition, the configuration disclosed in Patent Document 14 suffers from the problem of increased power consumption due to the flow of current between control terminals by way of interposed resistance elements.

The configuration disclosed in Patent Document 15 employs an FET that is a nonlinear element to realize variable resistance and therefore suffers from the problem that distortion is made even greater.

SUMMARY

It is an exemplary object of the present invention to provide a switch circuit that can reduce even-order distortion that occurs in a switch unit in the OFF state and a semiconductor device provided with this switch circuit.

In order to achieve the above-described object, the switch circuit of an exemplary aspect of the present invention is a switch circuit for passing or blocking a high-frequency signal and includes a correction circuit for correcting an impedance component that is present in the switch circuit and that changes asymmetrically with the direct-current potential as reference such that impedance seen from either of high-frequency terminals changes symmetrically with the direct-current potential as reference in response to positive and negative changes that take the direct-current potential of the high-frequency signal as reference.

The semiconductor device of an exemplary aspect the present invention is a configuration provided with the above-described switch circuit.

Asymmetrical impedance components in the exemplary aspect of the present invention that can be considered include the ground parasitic capacitance that exists between the ground potential and gate electrodes of the field-effect transistors that are provided in the switch circuit and resistance elements that are connected between the control terminal and the gate electrodes of the field-effect transistors.

EXEMPLARY EMBODIMENT

Explanation next regards the present invention with reference to the accompanying figures.

Because the drain and source of an FET used in a switch circuit normally have the same construction, these components are generally not distinguished. However, for the sake of convenience in the following description, the drains and sources of FETs will be distinguished to clarify the connection relations of each element provided in a switch circuit.

Figure 1:
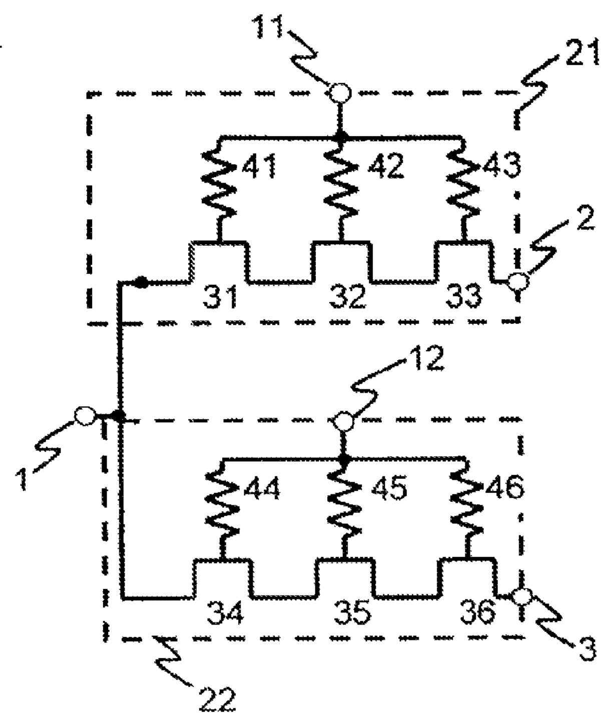
FIG. 1 shows a switch circuit of the background art that employs FETs, and is a circuit diagram showing the configuration of an SPDT switch circuit.
Figure 2:
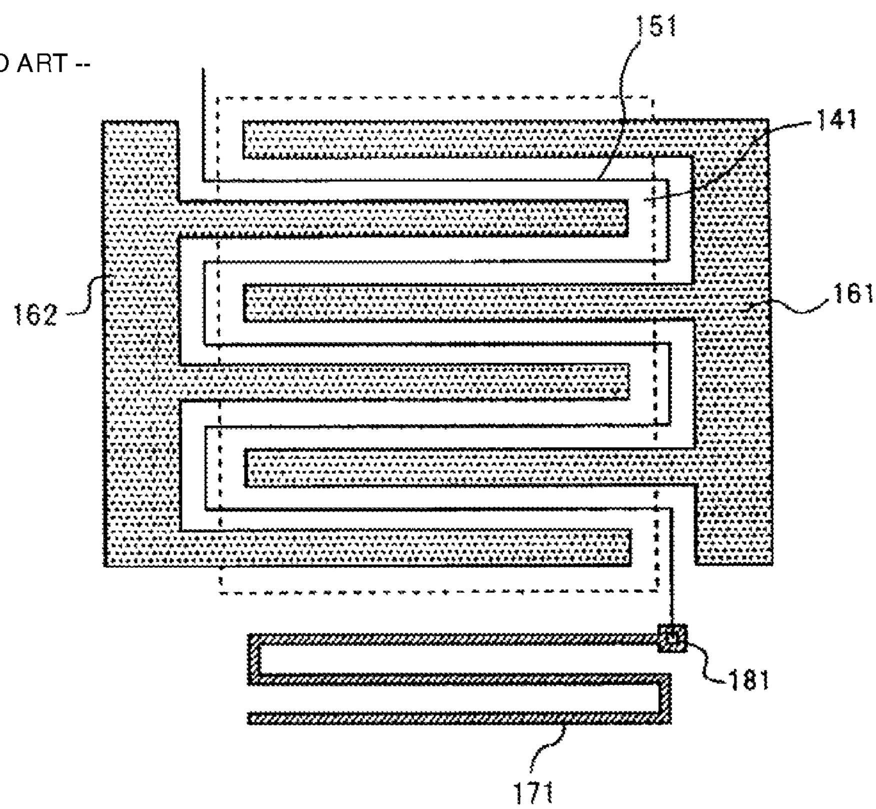
FIG. 2 is a plan view showing the configuration of an FET provided in the switch circuit shown in FIG. 1.
Figure 3:
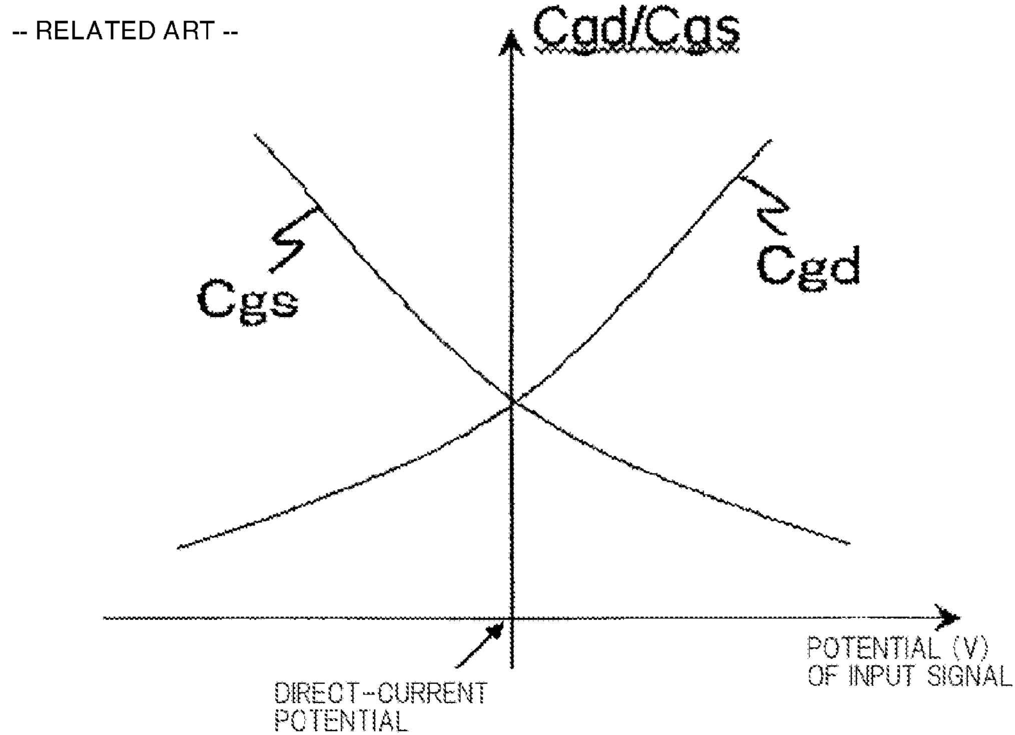
FIG. 3 is a graph showing change in the gate-source capacitance and gate-drain capacitance with respect to applied potential in the OFF state of the FET shown in FIG. 1.

For example, in the SPOT switch circuit shown in FIG. 1, the electrode of the FET on the side of first high-frequency terminal 1 will be defined as the drain, and the electrode of the FET on the side of second high-frequency terminal 2 or third high-frequency terminal 3 will be defined as the source. Similarly, in the SPST switch circuit (first switch unit 21 and second switch unit 22 shown in FIG. 1), the electrode of the FET on the side of first high-frequency terminal 1 is defined as the drain and the electrode of the FET on the side of second high-frequency terminal 2 is defined as the source.

First Exemplary Embodiment

Figure 4:
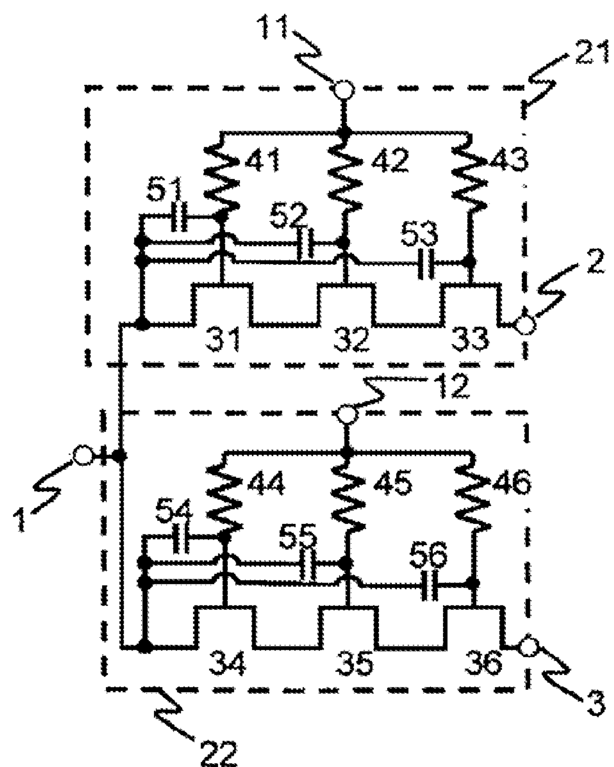
FIG. 4 is a circuit diagram showing the configuration of the switch circuit of the first exemplary embodiment.

FIG. 4 is a circuit diagram showing the configuration of the switch circuit of the first exemplary embodiment. FIG. 4 is an example in which the configuration of the present exemplary embodiment is applied to an SPDT switch circuit.

As shown in FIG. 4, the switch circuit of the first exemplary embodiment is of a configuration in which, to first switch unit 21 and second switch unit 22 provided in the SPDT switch circuit of the background art shown in FIG. 1, capacitance elements (correction capacitance elements) 51-53 are added to first switch unit 21 and capacitance elements (correction capacitance elements) 54-56 are added to second switch unit 22.

Capacitance element 51 is connected between first high-frequency terminal 1 and the gate electrode of FET 31, capacitance element 52 is connected between first high-frequency terminal 1 and the gate electrode of FET 32, and capacitance element 53 is connected between first high-frequency terminal 1 and the gate electrode of FET 33.

In addition, capacitance element 54 is connected between first high-frequency terminal 1 and the gate electrode of FET 34, capacitance element 55 is connected between first high-frequency terminal 1 and the gate electrode of FET 35, and capacitance element 56 is connected between first high-frequency terminal 1 and the gate electrode of FET 36.

As described above, the gate electrodes of FETs 31-36 are formed with a large gate width, and a high resistance of from several kΩ to several hundred kΩ is used in resistance elements 41-46 that are connected to the gate electrodes. These FETs with large gate width and resistance elements of large resistance therefore have a large layout area and a corresponding large parasitic capacitance, the parasitic capacitance with respect to the ground potential (hereinbelow referred to as the "ground parasitic capacitance") being particularly increased.

Figure 5:
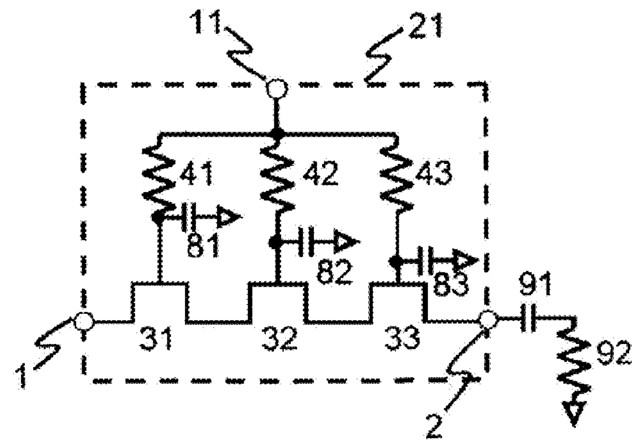
FIG. 5 is a circuit diagram clearly showing the ground parasitic capacitance provided in the first switch unit shown in FIG. 1.

FIG. 5 is a circuit diagram showing the ground parasitic capacitances 81-83 of first switch unit 21 provided in the switch circuit of the background art shown in FIG. 1, and further, to which are added capacitance element 91 and termination resistance 92 that are connected at the time of use of the switch circuit. Capacitance element 91 is provided for both passing a high-frequency signal and blocking a direct-current voltage. Termination resistance 92 is provided for adjusting the impedance with the signal line to which high-frequency terminal 2 is connected.

As shown in FIG. 5, ground parasitic capacitances 81-83 are present between the ground potential and the gate electrodes at FETs 31-33. Conventionally, the influence upon switch characteristics resulting from these ground parasitic capacitances 81-83 has not been investigated.

Figure 6:
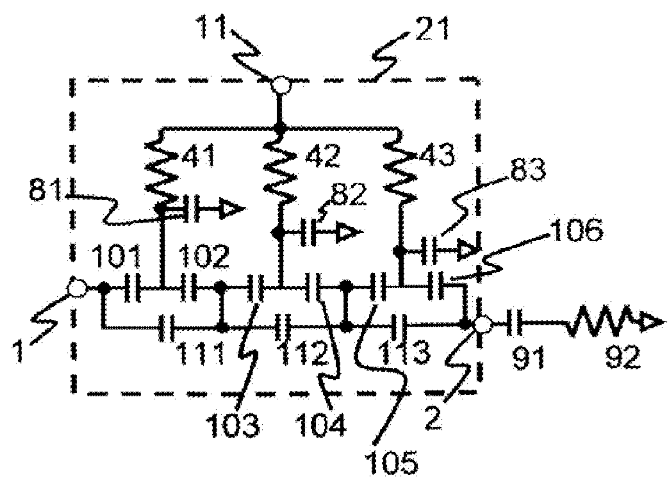
FIG. 6 is a circuit diagram showing an equivalent circuit when each FET provided in the first switch unit shown in FIG. 5 is in the OFF state.

FIG. 6 shows an equivalent circuit when each FET provided in first switch unit 21 shown in FIG. 5 is in the OFF state.

As shown in FIG. 6, in FET 31 in the OFF state, the drain/source-gate capacitances (Cgd/Cgs) 101 and 102 can be exchanged with drain-source capacitance (Cds) 111.

Similarly, in FET 32 in the OFF state, Cgd/Cgs 103 and 104 can be exchanged with Cds 112, and in FET 33 in the OFF state, Cgd/Cgs 105 and 106 can also be exchanged with Cds 113.

As can be understood from the equivalent circuit shown in FIG. 6, ground parasitic capacitances 81-83 that exist at the gate electrodes of each FET in the switch circuit of the background art are each a factor for changing the impedance of the switch unit as seen from either high-frequency terminal asymmetrically with respect to the direct-current potential. In other words, even-order distortion increases because the impedance of the switch unit changes asymmetrically with the direct-current potential of the high-frequency signal as a reference in response to changes in potential of the high-frequency signal that is applied in the OFF state. In the present exemplary embodiment, capacitance elements 51-56 shown in FIG. 4 are added to correct this asymmetric change in impedance.

Figure 7:
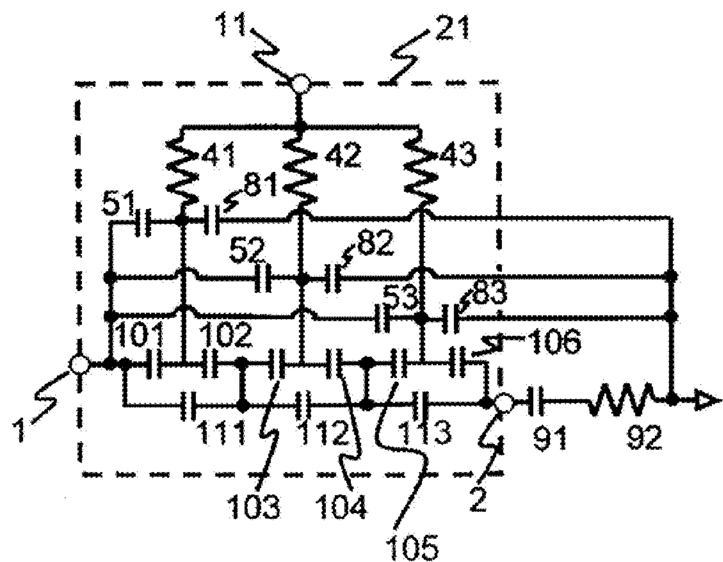
FIG. 7 is a circuit diagram showing an equivalent circuit when each FET provided in the first switch unit shown in FIG. 4 is in the OFF state.

FIG. 7 shows an equivalent circuit when each FET provided in first switch unit 21 shown in FIG. 4 is in the OFF state.

As shown in FIG. 7, in the switch circuit of the present exemplary embodiment, connecting capacitance elements 51-53 between first high-frequency terminal 1 and the gate electrodes of FETs 31-33 balances the impedance of ground parasitic capacitances 81-83 present at the gate electrodes of FETs 31-33 and the impedance of capacitance elements 51-53. Accordingly, the occurrence of even-order distortion can be suppressed because the impedance of the switch unit can be changed substantially symmetrically with the direct-current potential of the high-frequency signal as reference in response to changes of potential of the high-frequency signal that is applied during the OFF state.

Capacitance element 91 is a component for both passing a high-frequency signal and blocking direct-current voltage as described hereinabove, and as a result, is a sufficiently large value compared to capacitance elements 51-53, ground parasitic capacitances 81-83, drain/source-gate capacitances 101-106, and drain-source capacitances 111-113. On the other hand, termination resistance 92 is a value of sufficiently smaller impedance than capacitance elements 51-53, ground parasitic capacitances 81-83, drain/source-gate capacitances 101-106, and drain-source capacitances 111-113. Accordingly, capacitance element 91 and termination resistance 92 can be ignored when investigating the symmetry of the impedance of the switch circuit.

Connecting capacitance elements 51-53 between first high-frequency terminal 1 and the gate electrodes of FETs 31-33 according to the switch circuit of the first exemplary embodiment corrects the asymmetry of the impedance of the switch unit that originates in the ground parasitic capacitance of the gate electrodes and therefore enables a reduction of the even-order distortion that occurs due to the application of the high-frequency signal to the switch unit in the OFF state.

Although explanation in the first exemplary embodiment regarded an example of an SPDT switch circuit, the configuration of the present exemplary embodiment is not limited to an SPDT switch circuit and can be applied to an nPmT switch provided with an n-port input and m-port output. In addition, although explanation of the first exemplary embodiment regarded a configuration in which first switch unit 21 and second switch unit 22 were each provided with three FETs 31-36 connected in a series, a configuration is also possible in which first switch unit 21 and second switch unit 22 are each provided with no more than two FETs connected in a series or provided with at least four FETs connected in a series.

Second Exemplary Embodiment

Figure 8:
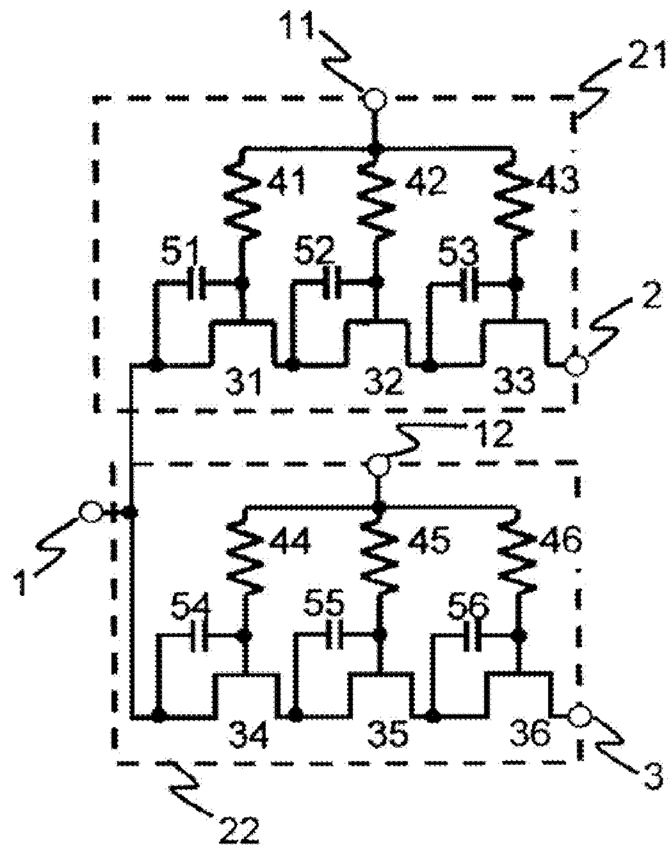
FIG. 8 is a circuit diagram showing the configuration of the switch circuit of the second exemplary embodiment.

FIG. 8 is a circuit diagram showing the configuration of the switch circuit of the second exemplary embodiment. FIG. 8 is an example in which the configuration of the present exemplary embodiment is applied to an SPDT switch circuit.

As shown in FIG. 8, the switch circuit of the second exemplary embodiment is of a configuration in which capacitance element (correction capacitance element) 51 is connected between the drain and gate electrode of FET 31, capacitance element (correction capacitance element) 52 is connected between the drain and gate electrode of FET 32, and capacitance element (correction capacitance element) 53 is connected between the drain and gate electrode of FET 33. In addition, capacitance element (correction capacitance element) 54 is connected between the drain and gate electrode of FET 34, capacitance element (correction capacitance element) 55 is connected between the drain and gate electrode of FET 35, and capacitance element (correction capacitance element) 56 is connected between the drain and gate electrode of FET 33. The configuration is otherwise the same as that of the switch circuit of the first exemplary embodiment and further explanation is therefore omitted.

Figure 9:
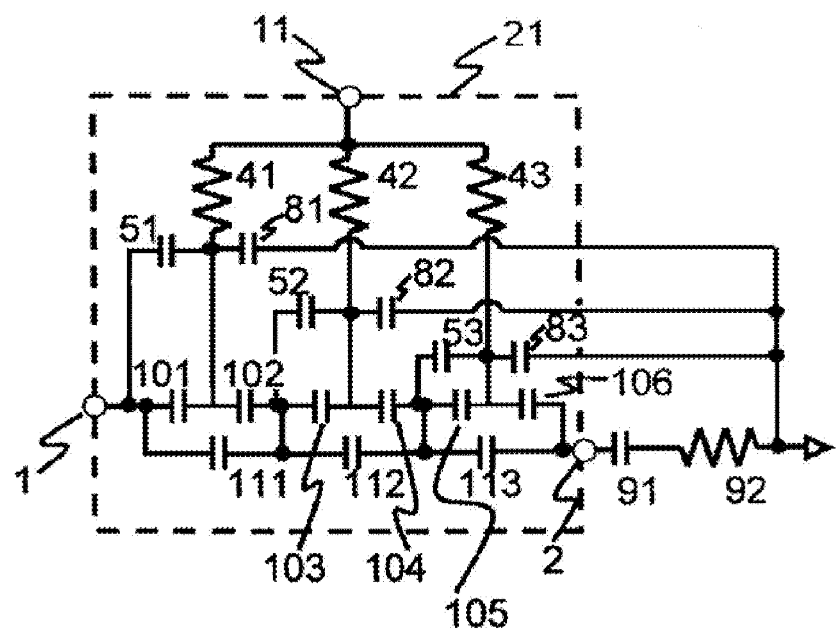
FIG. 9 is a circuit diagram showing an equivalent circuit when each FET provided in the first switch unit shown in FIG. 8 is in the OFF state.

FIG. 9 shows an equivalent circuit when each FET provided in first switch unit 21 shown in FIG. 8 is in the OFF state.

In the switch circuit of the first exemplary embodiment, capacitance elements 51-53 were connected between first high-frequency terminal 1 and the gate electrode of each FET, but in the second exemplary embodiment, capacitance elements 51-53 are connected between the drain and gate electrode of each FET as shown in FIG. 9.

For example, in an FET formed on an SOI (Silicon on Insulator) substrate or semi-insulating substrate composed of gallium arsenide, the values of ground parasitic capacitances 81-83 of gate electrodes are sufficiently low compared to the values of Cgd/Cgs 101-106 and Cds 111-113 and can therefore be ignored when investigating the symmetry of the impedance of the switch circuit.

Thus, the switch circuit of the second exemplary embodiment operates the same as the switch circuit of the first exemplary embodiment even though capacitance elements 51-56 are connected between the drains and gate electrodes of FETs 31-36 as shown in FIG. 8 and can therefore obtain the same effect as the first exemplary embodiment.

Although explanation in the second exemplary embodiment regards an example of an SPDT switch circuit, the configuration of the present exemplary embodiment is not limited to an SPDT switch circuit and can be applied to an nPmT switch provided with an n-port input and m-port output. In addition, although explanation in the second exemplary embodiment regards an example of a configuration in which first switch unit 21 and second switch unit 22 are provided with three FETs 31-36 connected in a series, first switch unit 21 and second switch unit 22 may be of a configuration provided with no more than two FETs connected in a series or at least four FETs connected in a series.

Third Exemplary Embodiment

Figure 10:
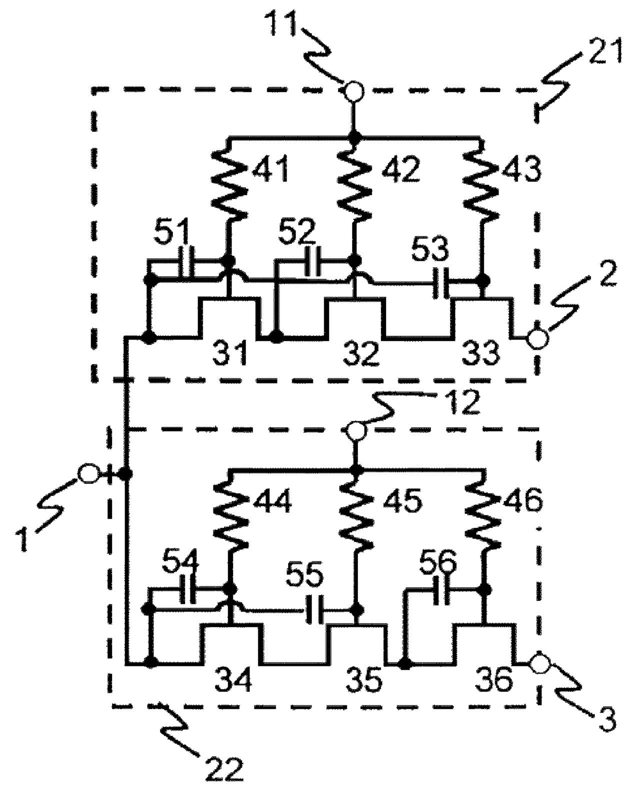
FIG. 10 is a circuit diagram showing the configuration of the switch circuit of the third exemplary embodiment.

FIG. 10 is a circuit diagram showing the configuration of the switch circuit of the third exemplary embodiment. FIG. 10 is an example in which the configuration of the present exemplary embodiment is applied to an SPDT switch circuit.

As shown in FIG. 10, the switch circuit of the third exemplary embodiment is of a configuration in which capacitance element (correction capacitance element) 51 is connected between first high-frequency terminal 1 and the gate electrode of FET 31, capacitance element (correction capacitance element) 52 is connected between the drain and gate electrode of FET 32, and capacitance element (correction capacitance element) 53 is connected between first high-frequency terminal 1 and the gate electrode of FET 33. In addition, the configuration is such that capacitance element (correction capacitance element) 54 is connected between first high-frequency terminal 1 and the gate electrode of FET 34, capacitance element (correction capacitance element) 55 is connected between first high-frequency terminal 1 and the gate electrode of FET 35, and capacitance element (correction capacitance element) 56 is connected between the drain and gate electrode of FET 33.

As explained in the first exemplary embodiment and second exemplary embodiment, capacitance elements 51-53 for correcting ground parasitic capacitances 81-83 of the gate electrodes may be connected between first high-frequency terminal 1 and the gate electrode of each of FETs 51-56, or may be connected between the drain and gate electrode of each of FETs 51-56.

The switch circuit of the third exemplary embodiment is of a configuration that combines the connection method of capacitance elements 51-56 shown in the first exemplary embodiment and the connection method of capacitance elements 51-56 shown in the second exemplary embodiment. Accordingly, the variations of configuration that can be considered in the switch circuit of the third exemplary embodiment increase with the number of FETs that are connected in a series provided in each switch unit. First switch unit 21 and second switch unit 22 shown in FIG. 10 show a representative example of the connection of capacitance elements 51-56, but the switch circuit of the third exemplary embodiment is not limited to the configuration shown in FIG. 10.

The switch circuit of the third exemplary embodiment operates the same as the switch circuits of the first exemplary embodiment and second exemplary embodiment and therefore can obtain the same effects as the switch circuits of the first exemplary embodiment and second exemplary embodiment.

Although explanation in the third exemplary embodiment regarded an example of an SPDT switch circuit, the configuration of the present exemplary embodiment is not limited to an SPDT switch circuit and can be applied to an nPmT switch provided with n-port input and m-port output. In addition, although explanation regarded an example of a configuration in which first switch unit 21 and second switch unit 22 are provided with three FETs 31-36 connected in a series, a configuration is also possible in which first switch unit 21 and second switch unit 22 are provided with no more than two FETs connected in a series or at least four FETs connected in a series.

Fourth Exemplary Embodiment

Figure 11:
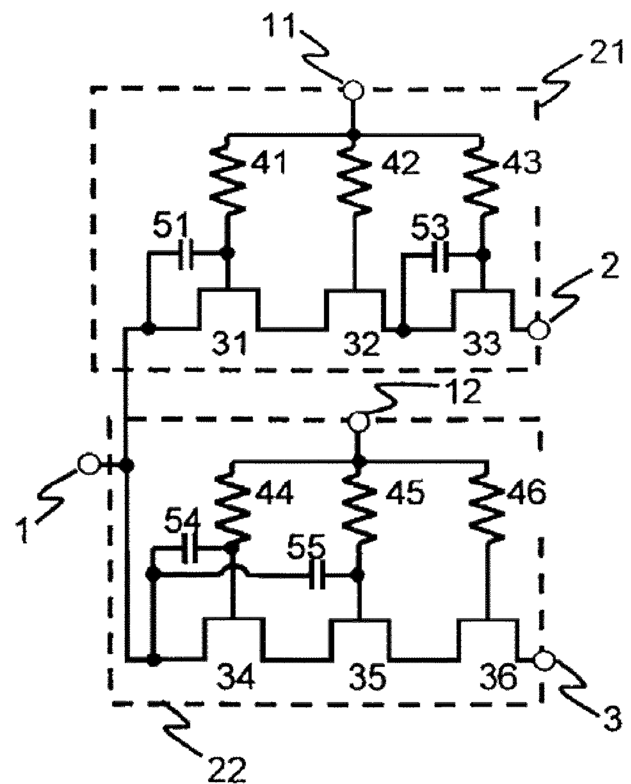
FIG. 11 is a circuit diagram showing the configuration of the switch circuit of the fourth exemplary embodiment.

FIG. 11 is a circuit diagram showing the configuration of the switch circuit of the fourth exemplary embodiment. FIG. 11 is an example in which the configuration of the present exemplary embodiment is applied to an SPDT switch circuit.

As shown in FIG. 11, the switch circuit of the fourth exemplary embodiment is of a configuration in which capacitance element 51 is connected between the drain and gate electrode of FET 31, and capacitance element 53 is connected between the drain and gate electrode of FET 33. Further, this switch circuit is a configuration in which capacitance element 54 is connected between first high-frequency terminal 1 and the gate electrode of FET 34 and capacitance element 55 is connected between first high-frequency terminal 1 and the gate electrode of FET 35.

The switch circuit of the fourth exemplary embodiment is a modification of the third exemplary embodiment, and is a configuration in which, rather than correcting the ground parasitic capacitances of the gate electrodes of all FET provided in the switch circuit, the ground parasitic capacitances of the gate electrodes of a portion of the FETs are not corrected. In other words, the switch circuit of the fourth exemplary embodiment is of a configuration that eliminates a portion of capacitance elements 51-56 that are connected to each FET provided in the switch circuit of the third exemplary embodiment. Accordingly, the variations of configurations that can be considered for the switch circuit of the fourth exemplary embodiment increase with the number of FETs connected in a series provided in each switch unit. First switch unit 21 and second switch unit 22 shown in FIG. 11 are representative examples of the connection of capacitance elements 51-56, but the switch circuit of the fourth exemplary embodiment is not limited to the configuration shown in FIG. 11.

Since not all of the ground parasitic capacitances of gate electrodes of FETs provided in the switch circuit are corrected in the switch circuit of the fourth exemplary embodiment, the effect of improving distortion is smaller than the switch circuits of the first to third exemplary embodiments. However, the correction of the asymmetry of the impedance of the switch units that originates in the ground parasitic capacitances of the gate electrodes enables a suppression of the occurrence of even-order distortion compared to the switch circuit of the background art shown in FIG. 1.

Although explanation in the fourth exemplary embodiment regards an example of an SPDT switch circuit, the configuration of the present exemplary embodiment is not limited to an SPDT switch circuit and can be applied to an nPmT switch provided with n-port input and m-port output. In addition, although explanation in the fourth exemplary embodiment regards an example of a configuration in which first switch unit 21 and second switch unit 22 are each provided with three FETs 31-36 connected in a series, a configuration is also possible in which first switch unit 21 and second switch unit 22 are each provided with no more than two FETs connected in a series or four or more FETs connected in a series.

In a case in which two or more switch units are provided in the switch circuit and different specifications are demanded of each switch unit, the configuration shown in the above-described first to fourth exemplary embodiments need not be applied in all switch units.

Figure 12:
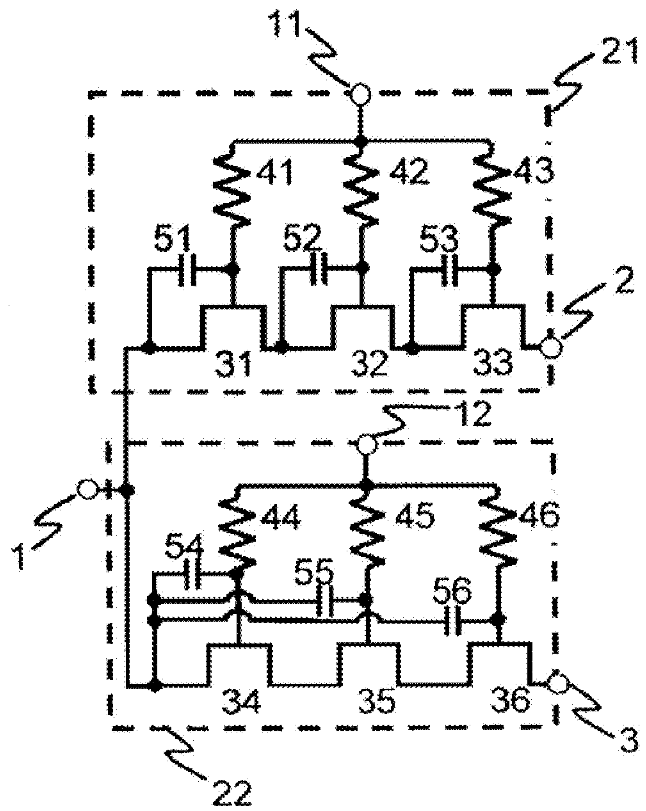
FIG. 12 is a circuit diagram showing a modification of the switch circuit shown in the first to fourth exemplary embodiments.
Figure 13:
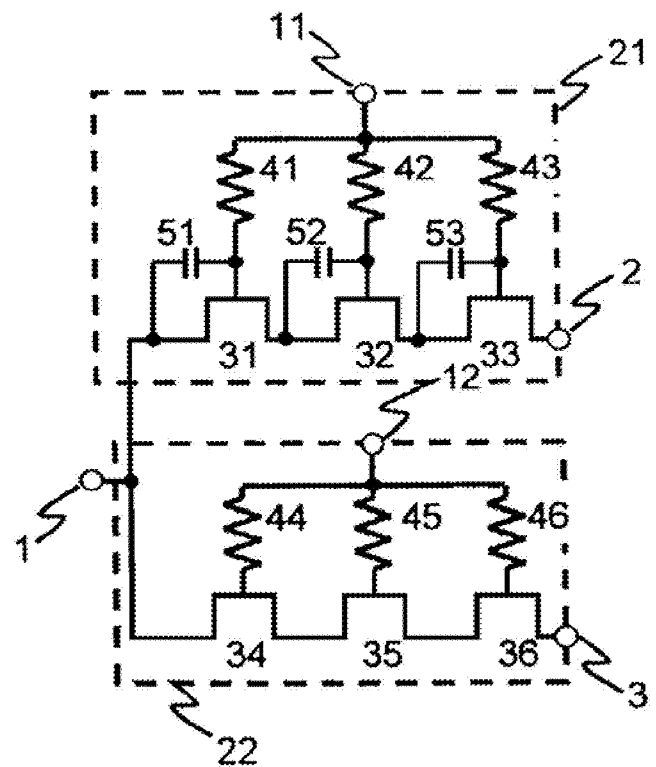
FIG. 13 is a circuit diagram showing a modification of the switch circuit shown in the first to fourth exemplary embodiments.
Figure 14:
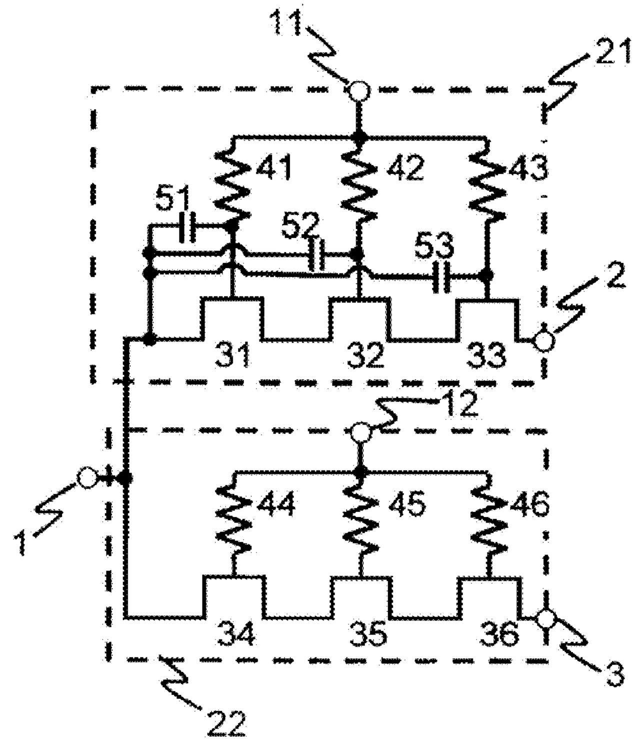
FIG. 14 is a circuit diagram showing a modification of the switch circuit shown in the first to fourth exemplary embodiments.

For example, a configuration is possible in which the switch unit shown in the first exemplary embodiment is combined with the switch unit shown in the second exemplary embodiment as shown in FIG. 12, a configuration is possible in which the switch unit shown in the second exemplary embodiment is combined with a switch unit of the background art as shown in FIG. 13, or a configuration is possible in which the switch unit shown in the first exemplary embodiment is combined with the switch unit of the background art as shown in FIG. 14.

Even when of a configuration provided with switch units of the background art as shown in FIGS. 13 and 14, the switch circuit of the present invention can be used as a switch circuit for switching the connections of a transmission circuit or reception circuit and antenna.

More specifically, in the switch circuit shown in FIG. 13, a transmission circuit may be connected to third high-frequency terminal 3, a reception circuit may be connected to second high-frequency terminal 2, and an antenna may be connected to first high-frequency terminal 1. During transmission, turning OFF first switch unit 21 connected to the reception circuit and turning ON second switch unit 22 connected to the transmission circuit enables supply of the high-frequency signal supplied from transmission circuit to the antenna. At this time, first switch unit 21 is of a configuration provided with capacitance elements 51-53 shown in the second exemplary embodiment, whereby the even-order distortion that is generated by the OFF state of first switch unit 21 can be reduced.

On the other hand, during reception, turning ON first switch unit 21 that is connected to the reception circuit and turning OFF second switch unit 22 that is connected to the transmission circuit enables supply of the high-frequency signal received by the antenna to the reception circuit. At this time, second switch unit 22 is of the same configuration as the background art, and as a result, the effect of reducing the even-order distortion that arises due to the OFF state of second switch unit 22 that was shown in the first to fourth exemplary embodiments cannot be expected.

Nevertheless, the intensity of a received signal is extremely small compared to the transmission signal and the even-order distortion generated in the switch circuit is also small, and the distortion component therefore does not present a problem.

In other words, the present invention should apply the configuration shown in the first to fourth exemplary embodiments such that the impedance as seen from either high-frequency terminal at which a high-power high-frequency signal is applied as input or supplied as output changes symmetrically with the direct-current potential of the high-frequency signal as reference in response to positive and negative changes that take the direct-current potential of the high-frequency signal as reference.

In the first to fourth exemplary embodiments, examples of configurations were shown in which a high-power high-frequency signal is received as input from first high-frequency terminal 1 and capacitance elements are connected between first high-frequency terminal 1 and the gate electrode of each FET or between the drain and gate electrode of each FET. However, because the effect of the present invention is related to the input direction of the high-frequency signal, when improving the symmetry of impedance seen from second high-frequency terminal 2 or third high-frequency terminal 3, capacitance elements 51-56 may be connected between second high-frequency terminal 2 or third high-frequency terminal 3 and the gate electrode of each FET or between the source and gate electrode of each FET. In the switch circuit of the present invention, however, switch units in which a capacitance element is connected between the drain and gate electrode of each FET must not be mixed with switch units in which a capacitance element is connected between the source and gate electrode of each FET. Similarly, switch units in which a capacitance element is connected between the first high-frequency terminal and the gate electrode of each FET must not be mixed with switch units in which a capacitance element is connected between second high-frequency terminal 2 or third high-frequency terminal 3 and the gate electrode of each FET.

Fifth Exemplary Embodiment

Figure 15:
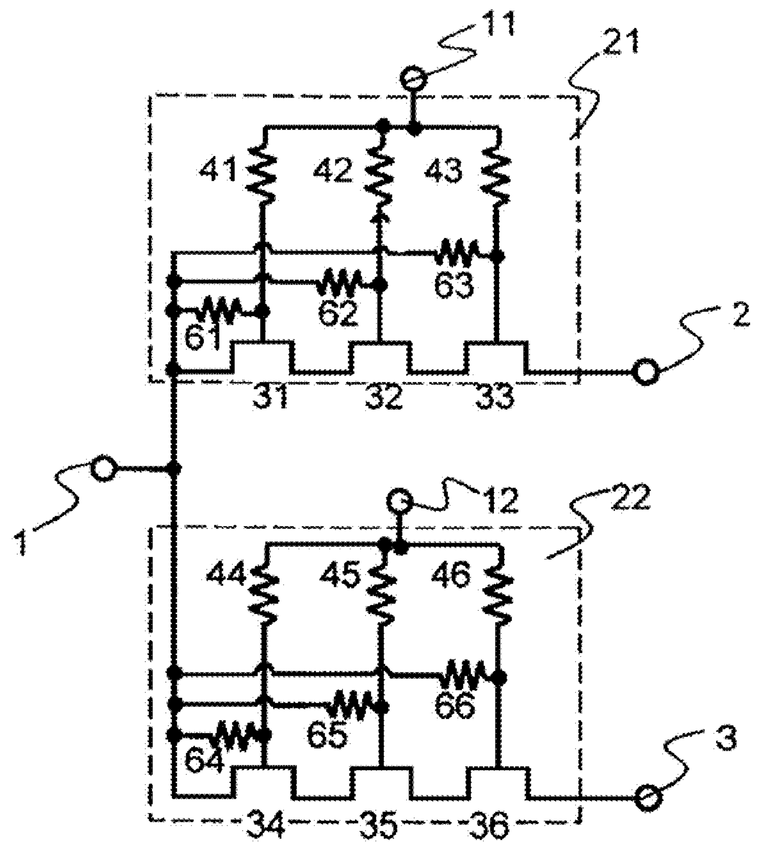
FIG. 15 is a circuit diagram showing an example of a first configuration of the switch circuit of the fifth exemplary embodiment.
Figure 16:
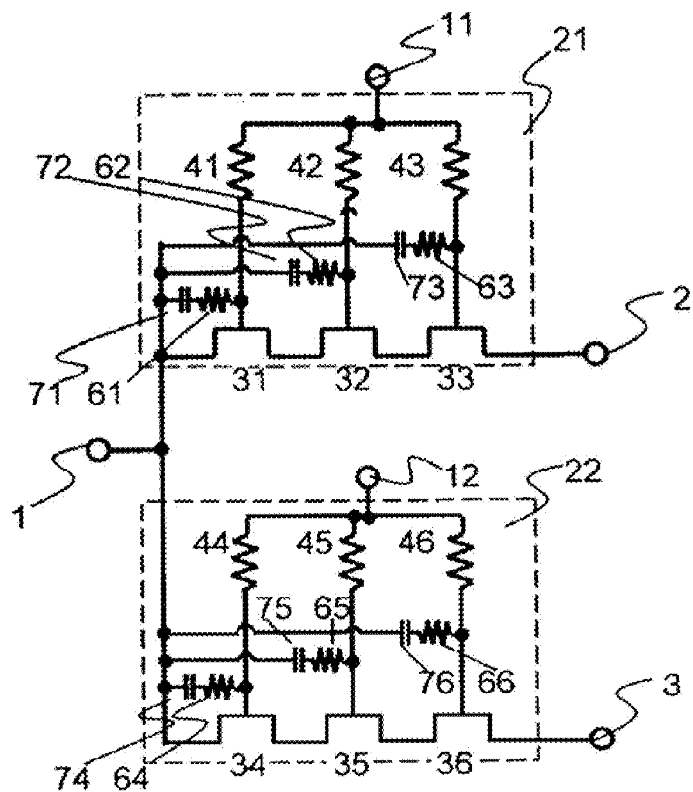
FIG. 16 is a circuit diagram showing an example of a second configuration of the switch circuit of the fifth exemplary embodiment.
Figure 17:
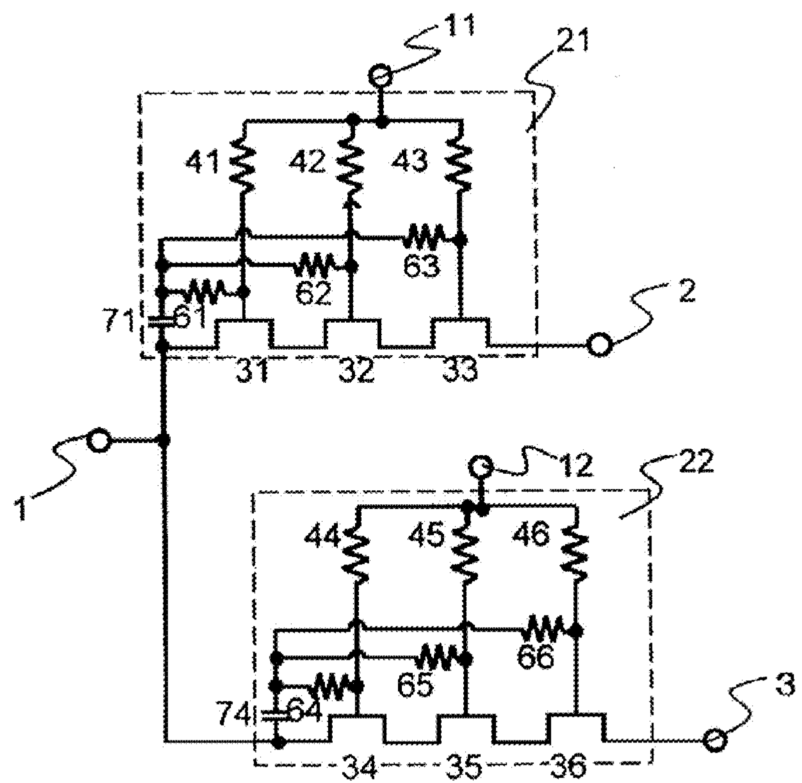
FIG. 17 is a circuit diagram showing an example of a third configuration of the switch circuit of the fifth exemplary embodiment.

FIG. 15, FIG. 16 and FIG. 17 are circuit diagrams showing examples of the configuration of the switch circuit of the fifth exemplary embodiment. FIGS. 15-17 show examples in which the configuration of the present exemplary embodiment is applied to an SPDT switch circuit.

FIG. 15 shows an example of a first configuration of the switch circuit of the fifth exemplary embodiment. The switch circuit shown in FIG. 15 is a configuration in which, to the first and second switch units 21 and 22 provided in SPDT switch circuit of the background art shown in FIG. 1, resistance elements (correction resistance elements) 61-63 are added to first switch unit 21 and resistance elements (correction resistance elements) 64-66 are added to second switch unit 22.

Resistance element 61 is connected between first high-frequency terminal 1 and the gate electrode of FET 31, resistance element 62 is connected between first high-frequency terminal 1 and the gate electrode of FET 32, and resistance element 63 is connected between first high-frequency terminal 1 and the gate electrode of FET 33.

In addition, resistance element 64 is connected between first high-frequency terminal 1 and the gate electrode of FET 34, resistance element 65 is connected between first high-frequency terminal 1 and the gate electrode of FET 35, and resistance element 66 is connected between first high-frequency terminal 1 and the gate electrode of FET 36.

FIG. 16 shows an example of a second configuration of the switch circuit of the fifth exemplary embodiment.

The switch circuit shown in FIG. 16 is of a configuration in which, to first and second switch units 21 and 22 provided in the SPDT switch circuit of the background art shown in FIG. 1, capacitance element 71 and resistance element 61 connected in a series, capacitance element 72 and resistance element 62 connected in a series, and capacitance element 73 and resistance element 63 connected in a series are added to first switch unit 21; and capacitance element 74 and resistance element 64 connected in a series, capacitance element 75 and resistance element 65 connected in a series, and capacitance element 76 and resistance element 66 connected in a series are added to second switch unit 22.

Capacitance element 71 and resistance element 61 are connected between first high-frequency terminal 1 and the gate electrode of FET 31, capacitance element 72 and resistance element 62 are connected between first high-frequency terminal 1 and the gate electrode of FET 32, and capacitance element 73 and resistance element 63 are connected between first high-frequency terminal 1 and the gate electrode of FET 33.

In addition, capacitance element 74 and resistance element 64 are connected between first high-frequency terminal 1 and the gate electrode of FET 34, capacitance element 75 and resistance element 65 are connected between first high-frequency terminal 1 and the gate electrode of FET 35, and capacitance element 76 and resistance element 66 are connected between first high-frequency terminal 1 and the gate electrode of FET 36.

FIG. 17 shows an example of a third configuration of the switch circuit of the fifth exemplary embodiment.

The switch circuit shown in FIG. 17 is of a configuration in which, to first and second switch units 21 and 22 provided in the SPDT switch circuit of the background art shown in FIG. 1, resistance elements 61-63 and capacitance element 71 are added to first switch unit 21 and resistance elements 64-66 and capacitance element 74 are added to second switch unit 22.

One end of resistance element 61 is connected to the gate electrode of FET 31, one end of resistance element 62 is connected to the gate electrode of FET 32, and one end of resistance element 63 is connected to the gate electrode of FET 33. The other ends of resistance elements 61-63 are connected to first high-frequency terminal 1 by way of capacitance element 61.

In addition, one end of resistance element 64 is connected to the gate electrode of FET 34, one end of resistance element 65 is connected to the gate electrode of FET 35, and one end of resistance element 66 is connected to the gate electrode of FET 36. The other ends of resistance elements 64-66 are connected to first high-frequency terminal 1 by way of capacitance element 64.

The third example of the configuration shown in FIG. 17 is a configuration in which capacitance elements 71-73 provided in the second example of the configuration shown in FIG. 16 are shared, and capacitance elements 74-76 are shared.

As described hereinabove, in the switch circuit of the background art, resistance elements 41-46 are connected to the gate electrodes of FETs 31-36 provided in first switch unit 21. Resistance elements 41-46 are provided to suppress the increase of the transmission loss of the high-frequency signal and the deterioration of the isolation properties between the high-frequency terminals that result from the flow of the high-frequency signal, which was applied as input to first switch unit 21, from the gate electrodes and via gate capacitance to control terminal 11. On the other hand, when attention is focused on the distortion that occurs in the switch circuit, these resistance elements 41-46 are the source of the previously described "asymmetry of impedance."

Figure 18:
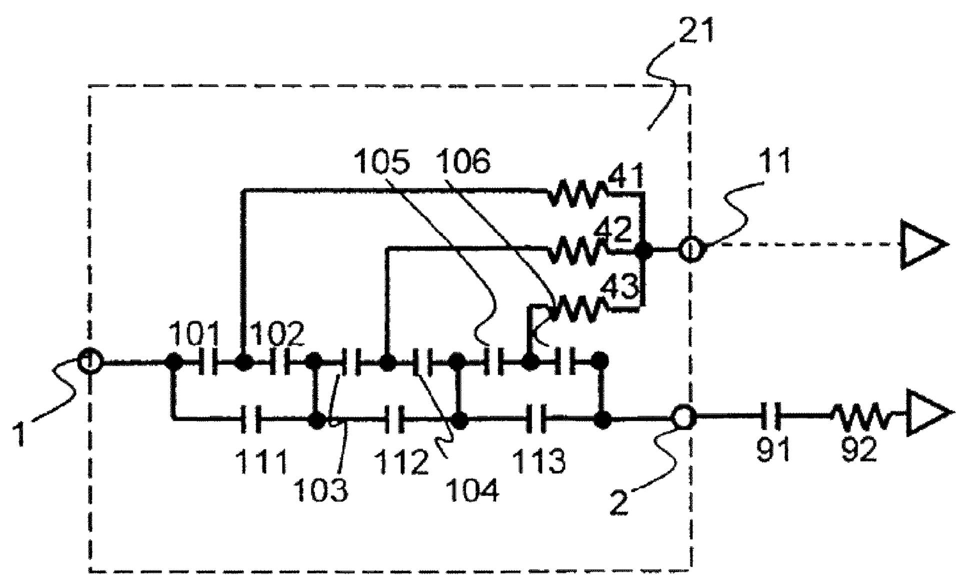
FIG. 18 is an equivalent circuit when each FET of the first switch unit shown in FIG. 1 is in the OFF state.
Figure 19:
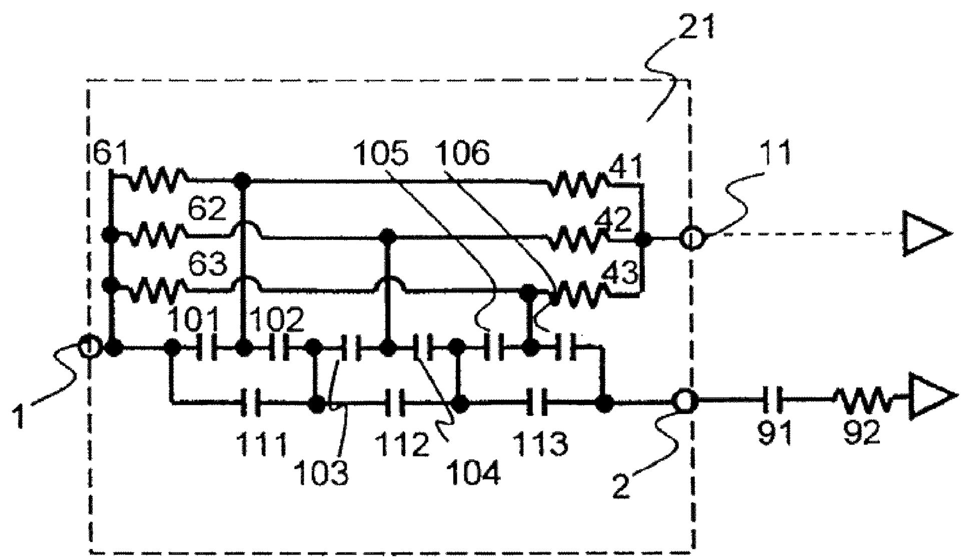
FIG. 19 is an equivalent circuit when each FET of the first switch unit shown in FIG. 15 is in the OFF state.

FIG. 18 shows an equivalent circuit when FETs 31-36 provided in first switch unit 21 of the switch circuit of the background art shown in FIG. 1 are in the OFF state, and FIG. 19 is an equivalent circuit when FETs 31-36 provided in first switch unit 21 of the switch circuit of the fifth exemplary embodiment shown in FIG. 15 are in the OFF state.

Capacitance element 91 shown in FIG. 18 and FIG. 19 is provided for both passing a high-frequency signal and blocking direct-current voltage. Termination resistance 92 is provided for adjusting the impedance with the signal line connected to high-frequency terminal 2.

In addition, the equivalent circuits shown in FIGS. 18 and 19 show a state that omits ground parasitic capacitances 81-83 that are present between the ground potential and the gate electrodes of FETs 31-33 shown in FIG. 5.

In FIG. 18, a control signal having frequency that is sufficiently lower than the high-frequency signal is applied as input to control terminal 11, whereby the control signal can be seen as a direct-current signal. In this case, resistance elements 41-43 are seen by the high-frequency signal as paths connecting to the ground potential and therefore serve as a source of asymmetry of the impedance of the switch circuit in the OFF state.

As described hereinabove, the occurrence of even-order distortion arises from the capacitance of FETs and the impedance of elements connected to FETs that change asymmetrically with the direct-current potential as a reference, whereby different voltage amplitudes are distributed across drain and source and across the drain and gate. Accordingly, resistance elements 41-46 also serve as a cause for the occurrence of even-order distortion.

In the switch circuit of the background art shown in FIG. 1, the values of resistance elements 41-43 are made large such that resistance elements 41-46 can be seen by the high-frequency signal as being in the open state. However, the use of resistance elements with high values has led to such problems as the drop in voltage caused by flow of current to the resistance elements, the increase in the ON/OFF switching time, and the increase in the layout area.

In the switch circuit of the present exemplary embodiment, connecting resistance elements 61-63 between first high-frequency terminal 1 and the gate electrodes of FETs 31-33 as shown in FIG. 19 balances the impedance of resistance elements 41-43 that are connected to the gate electrodes of FETs 31-33 and the impedance of resistance elements 61-63.

Accordingly, the impedance of the switch unit can be changed substantially symmetrically with the direct-current potential of the high-frequency signal as a reference in response to changes in potential of the high-frequency signal that is applied during the OFF state, and the occurrence of even-order distortion can be suppressed.

Capacitance element 91 is provided for both passing the high-frequency signal and blocking direct-current voltage as described hereinabove, and is therefore made a value that is sufficiently large compared to capacitance elements 61-63, resistance elements 41-43, drain/source-gate capacitances 101-106, and drain-source capacitances 111-113. On the other hand, termination resistance 92 is a value such that impedance is sufficiently small compared to capacitance elements 61-63, resistance elements 41-43, drain/source-gate capacitances 101-106, and drain-source capacitances 111-113. Accordingly, capacitance element 91 and termination resistance 92 can be ignored when investigating the symmetry of the impedance of the switch circuit.

In the first example of configuration of the fifth exemplary embodiment, connecting resistance elements 61-63 between first high-frequency terminal 1 and the gate electrodes of FETs 31-33 corrects the asymmetry of the impedance of the switch unit that arises in resistance elements 41-43 that are connected between control terminal 11 and the gate electrodes of FETs 31-33. As a result, the even-order distortion that occurs due to the application of the high-frequency signal to the switch unit in the OFF state can be reduced.

However, in the first example of the configuration, a direct-current current flows between a control terminal to which a high level is applied as input and a control terminal to which a low level is applied as input, giving rise to the new problem of increased power consumption that limits the usage of the configuration.

The second example of the configuration is a configuration in which capacitance elements 71-73 for blocking direct-current current are connected in a series with resistance elements 61-63 to circumvent this problem. The third example of the configuration is a configuration in which capacitance elements 71-73 shown in the second example of the configuration are shared to decrease the number of capacitance elements and reduce the layout area.

Figure 20:
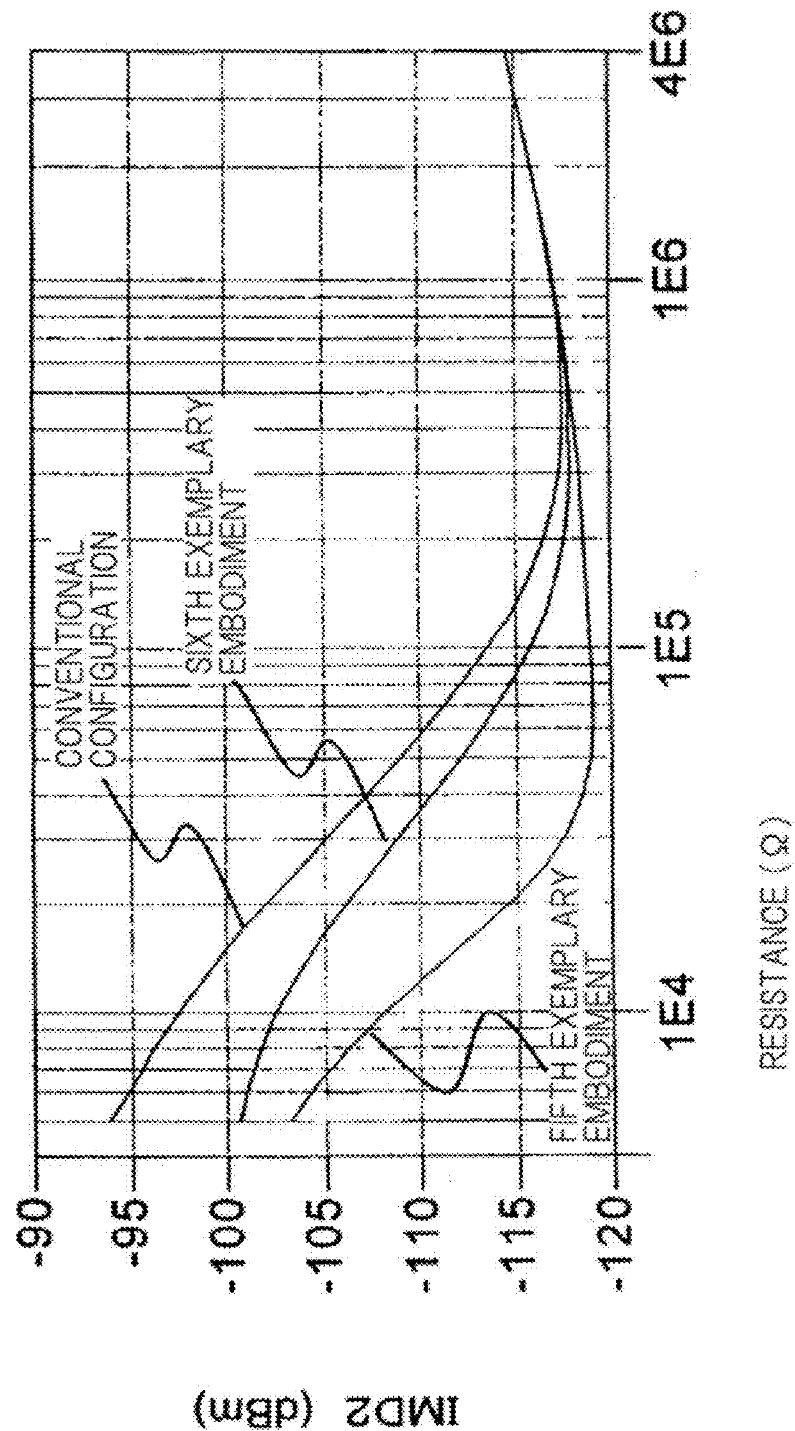
FIG. 20 is a graph showing the simulation results of secondary intermodulation distortion for the value of resistance elements of the switch circuits of the fifth exemplary embodiment and sixth exemplary embodiment.

FIG. 20 shows the simulation results of the value of secondary intermodulation distortion (IMD2) with respect to the value of the resistance elements (resistance elements 41-46) of the switch circuit of the fifth exemplary embodiment shown in FIG. 16. In addition, FIG. 20 shows the simulation results of the characteristic of the secondary intermodulation distortion with respect to the value of the resistance elements of the switch circuit of the background art shown in FIG. 1 and the switch circuit of the sixth exemplary embodiment that will be described later.

As shown in FIG. 20, increasing the values of resistance elements 41-46 that are connected between the control terminal and the gate electrodes of FETs in the switch circuit of the background art reduces the secondary intermodulation distortion (IMD2). In contrast, in the switch circuit of the fifth exemplary embodiment, the secondary intermodulation distortion can be reduced even for low values of resistance elements 41-46 that are connected between the control terminal and the gate electrodes of FETs.

Although explanation in the fifth exemplary embodiment regarded the example of an SPDT switch circuit, the configuration of the fifth exemplary embodiment is not limited to an SPDT switch circuit and can also be applied to an nPmT switch provided with n-port input and m-port output. In addition, although an example was described in the fifth exemplary embodiment of a configuration in which first switch unit 21 and second switch unit 22 are each provided with three FETs 31-36 connected in a series, a configuration is also possible in which first switch unit 21 and second switch unit 22 are each provided with no more than two FETs connected in a series or four or more FETs connected in a series.

In the fifth exemplary embodiment, the greatest reduction of even-order distortion is possible when the values of resistance elements 61-66 and the values of resistance elements 41-46 shown in FIGS. 15-17 are equal. However, the values of resistance element 61-66 and resistance elements 41-46 may be considered one design parameter that is set as appropriate according to the value of even-order distortion that can be permitted in a device provided with the switch circuit of the present exemplary embodiment, and the values of resistance elements 61-66 and the values of resistance elements 41-46 need not be equal.

In addition, the values of capacitance elements 71-76 shown in FIG. 16 and capacitance elements 71 and 74 shown in FIG. 17 should be sufficiently low compared to the impedance of resistance elements 41-46 for a high-frequency signal, and the values of capacitance elements 71-76 may therefore also be considered one design parameter. Other elements such as diodes or FETs may also be used in place of capacitance elements 71-76 if they can block a direct-current current.

Sixth Exemplary Embodiment

Figure 21:
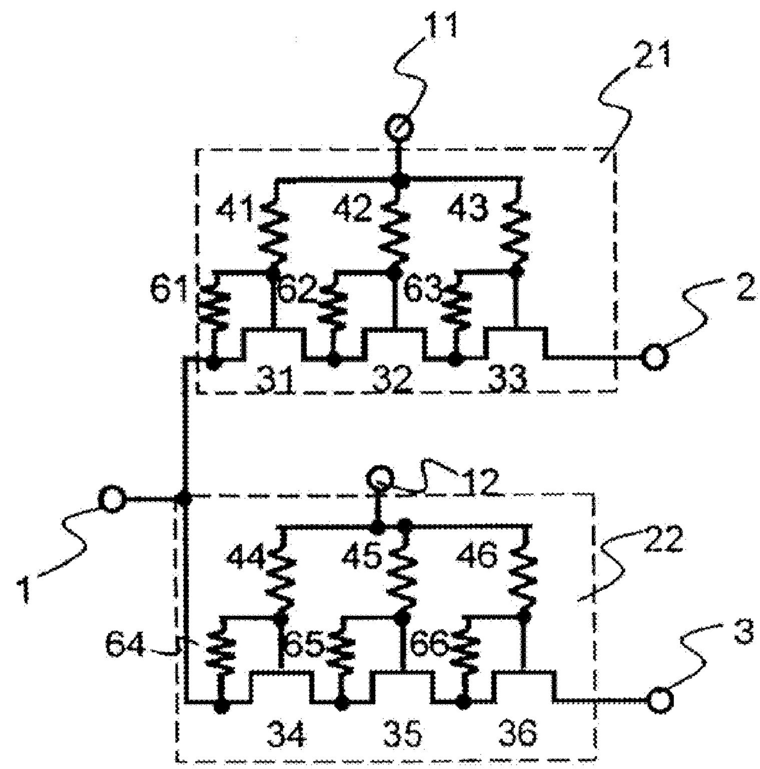
FIG. 21 is a circuit diagram showing an example of a first configuration of the switch circuit of the sixth exemplary embodiment.
Figure 22:
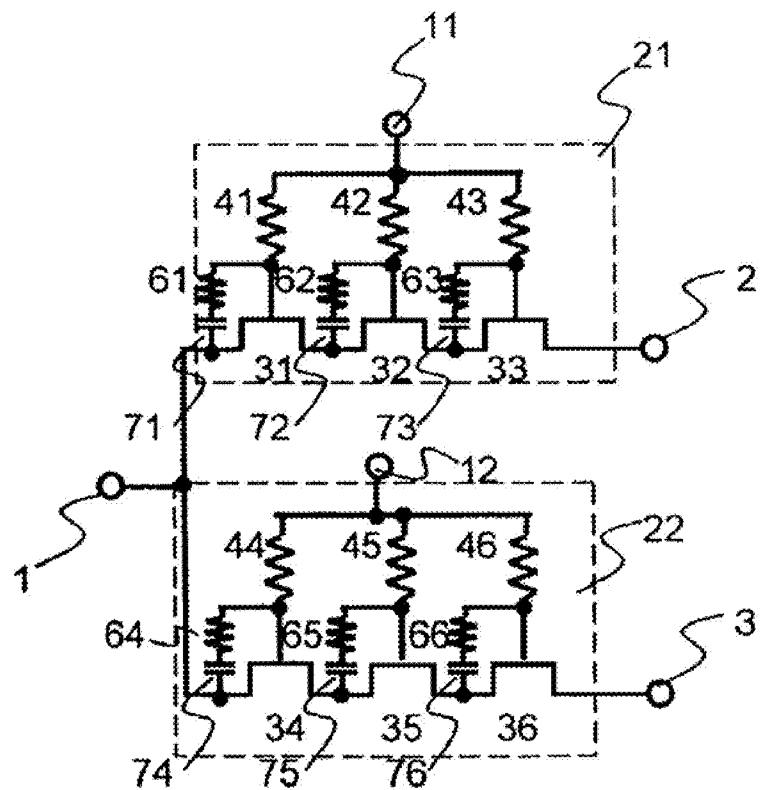
FIG. 22 is a circuit diagram showing an example of a second configuration of the switch circuit of the sixth exemplary embodiment.

FIGS. 21 and 22 are circuit diagrams showing examples of the configuration of the switch circuit of the sixth exemplary embodiment. FIGS. 21 and 22 are examples that apply the configuration of the present exemplary embodiment to an SPDT switch circuit.

FIG. 21 shows an example of a first configuration of the switch circuit of the sixth exemplary embodiment.

The switch circuit shown in FIG. 21 is a configuration in which, to first switch unit 21 and second switch unit 22 provided in the SPDT switch circuit of the background art shown in FIG. 1, resistance elements (correction resistance elements) 61-63 are added to first switch unit 21 and resistance elements (correction resistance elements) 64-66 are added to second switch unit 22.

Resistance element 61 is connected between the drain electrode and gate electrode of FET 31, resistance element 62 is connected between the drain electrode and gate electrode of FET 32, and resistance element 63 is connected between the drain electrode and gate electrode of FET 33.

In addition, resistance element 64 is connected between the drain electrode and gate electrode of FET 34, resistance element 65 is connected between the drain electrode and gate electrode of FET 35, and resistance element 66 is connected between the drain electrode and gate electrode of FET 36.

FIG. 22 shows an example of a second configuration of the switch circuit of the sixth exemplary embodiment.

The switch circuit shown in FIG. 22 is of a configuration in which, to first switch unit 21 and second switch unit 22 provided in the SPDT switch circuit of the background art shown in FIG. 1, capacitance element 71 and resistance element 61 that are connected in a series, capacitance element 72 and resistance element 62 that are connected in a series, and capacitance element 73 and resistance element 63 that are connected in a series are added to first switch unit 21, and capacitance element 74 and resistance element 64 that are connected in a series, capacitance element 75 and resistance element 65 that are connected in a series, and capacitance element 76 and resistance element 66 that are connected in a series are added to second switch unit 22.

Capacitance element 71 and resistance element 61 are connected between the drain electrode and gate electrode of FET 31, capacitance element 72 and resistance element 62 are connected between the drain electrode and gate electrode of FET 32, and capacitance element 73 and resistance element 63 are connected between the drain electrode and gate electrode of FET 33.

In addition, capacitance element 74 and resistance element 64 are connected between the drain electrode and gate electrode of FET 34, capacitance element 75 and resistance element 65 are connected between the drain electrode and gate electrode of FET 35, and capacitance element 76 and resistance element 66 are connected between the drain electrode and gate electrode of FET 36.

Figure 23:
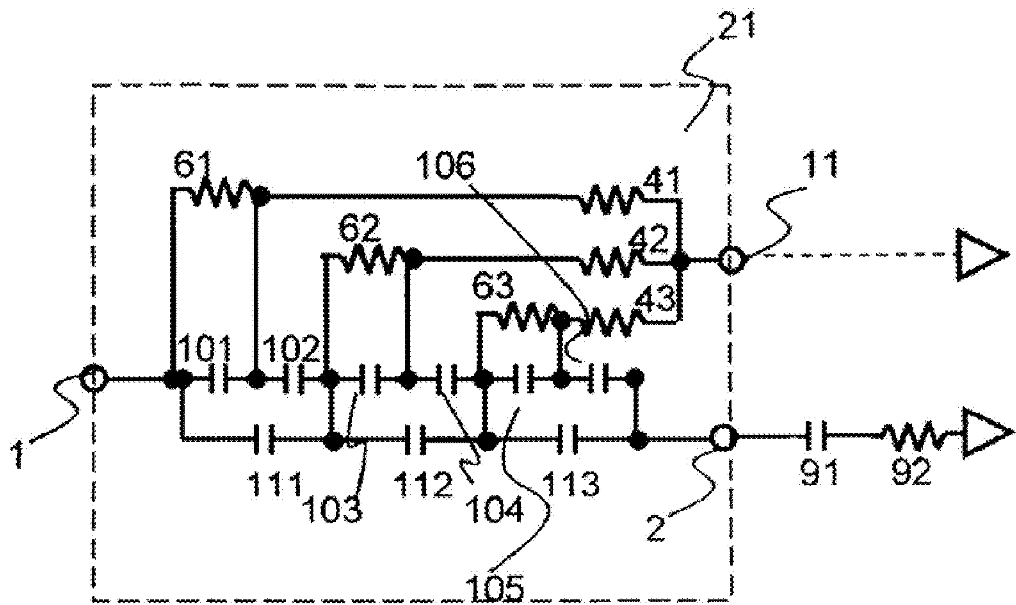
FIG. 23 is an equivalent circuit when each FET of the first switch unit shown in FIG. 21 is in the OFF state.

FIG. 23 shows an equivalent circuit of first switch unit 21 when each FET provided in first switch unit 21 shown in FIG. 21 is in the OFF state.

In the switch circuit of the above-described fifth exemplary embodiment, resistance elements 61-63 are connected between first high-frequency terminal 1 and the gate electrode of each FET, but in the sixth exemplary embodiment, resistance elements 61-63 are connected between the drain and gate electrode of each FET.

In the switch circuit of the present exemplary embodiment, connecting resistance elements 61-63 between the drains and gate electrodes of FETs 31-33 balances the impedance of resistance elements 41-43 connected between control terminal 11 and the gates of FETs 31-33 and the impedance of resistance elements 61-63.

Accordingly, as with the fifth exemplary embodiment, the occurrence of even-order distortion can be suppressed because the impedance of the switch unit can be changed substantially symmetrically with the direct-current potential of a high-frequency signal as reference in response to changes in potential of a high-frequency signal applied during the OFF state.

Capacitance element 91 is an element for both passing a high-frequency signal and blocking a direct-current voltage as described hereinabove and is therefore a value that is sufficiently large compared to capacitance elements 61-63, resistance elements 41-43, drain/source-gate capacitances 101-106 and drain-source capacitances 111-113. On the other hand, termination resistance 92 is a value such that impedance is sufficiently low compared to capacitance elements 61-63, resistance elements 41-43, drain/source-gate capacitances 101-106 and drain-source capacitances 111-113. Accordingly, capacitance element 91 and termination resistance 92 can be ignored when investigating the symmetry of the impedance of a switch circuit.

Although explanation in the sixth exemplary embodiment regarded the example of an SPDT switch circuit, the configuration of the present exemplary embodiment is not limited to an SPDT switch circuit and can be applied to an nPmT switch provided with n-port input and m-port output.

Although explanation in the sixth exemplary embodiment regarded the example of a configuration in which first switch unit 21 and second switch unit 22 are each provided with three FETs 31-36 connected in a series, first switch unit 21 and second switch unit 22 may each be of a configuration provided with no more than two FETs connected in a series or four or more FETs connected in a series.

In the sixth exemplary embodiment, as in the fifth exemplary embodiment, the maximum reduction of even-order distortion is possible when the values of resistance elements 61-66 and the values of resistance elements 41-46 shown in FIG. 21 and FIG. 22 are equal. However, the values of resistance elements 61-66 and resistance elements 41-46 can be considered as one design parameter that is set as appropriate according to the value of even-order distortion that can be permitted in a device provided with the switch circuit of the present exemplary embodiment, and the values of resistance elements 61-66 and the values of resistance elements 41-46 need not be made equal.

In addition, the values of capacitance elements 71-76 shown in FIG. 22 should be sufficiently low compared to the impedance of resistance elements 41-46 to a high-frequency signal, and the values of capacitance elements 71-76 can therefore be considered as one design parameter. Other elements such as diodes or FETs that can block direct-current current may also be used in place of capacitance elements 71-76.

Seventh Exemplary Embodiment

Figure 24:
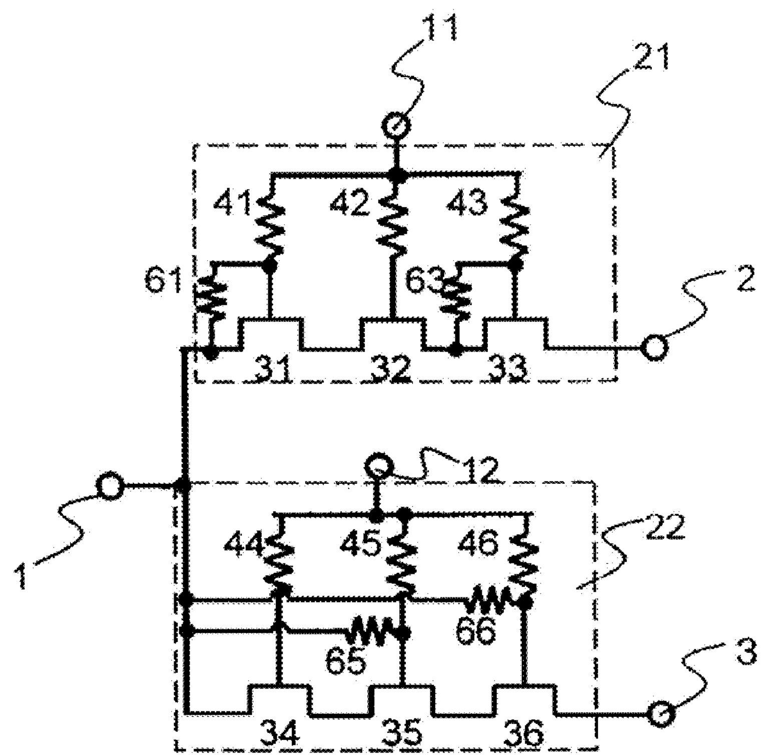
FIG. 24 is a circuit diagram showing an example of a first configuration of the switch circuit of the seventh exemplary embodiment.
Figure 25:
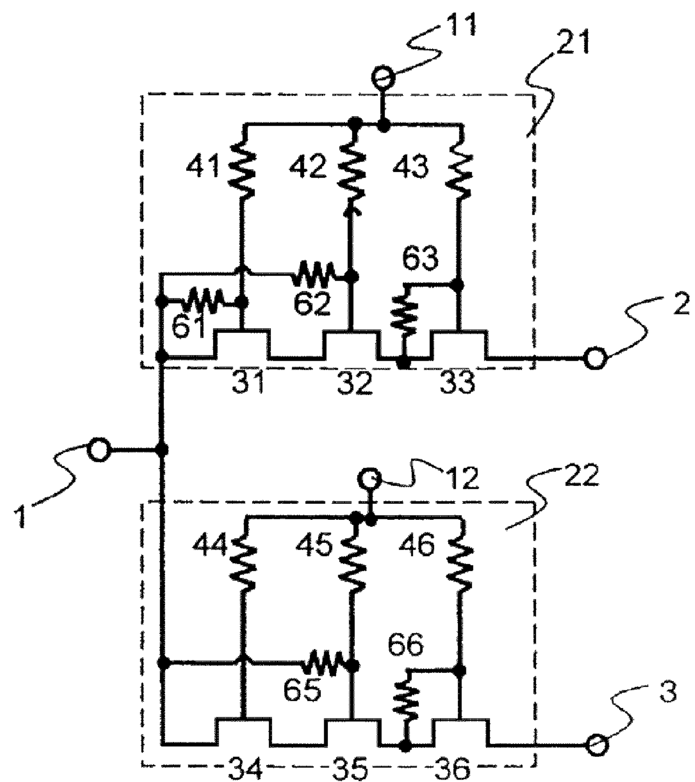
FIG. 25 is a circuit diagram showing an example of a second configuration of the switch circuit of the seventh exemplary embodiment.
Figure 26:
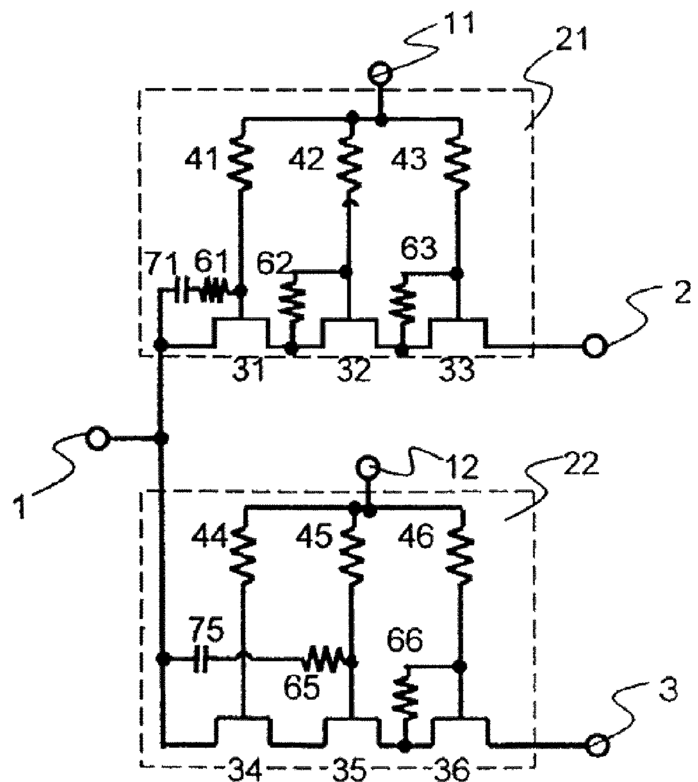
FIG. 26 is a circuit diagram showing an example of a third configuration of the switch circuit of the seventh exemplary embodiment.

FIGS. 24, 25, and 26 are circuit diagrams showing an example of the configuration of the switch circuit of the seventh exemplary embodiment. FIGS. 24-26 are examples of the application of the configuration of the present exemplary embodiment to an SPDT switch circuit.

FIG. 24 shows an example of a first configuration of the switch circuit of the seventh exemplary embodiment.

The switch circuit shown in FIG. 24 is a configuration in which, to first switch unit 21 and second switch unit 22 provided in the SPDT switch circuit of the background art shown in FIG. 1, resistance elements (correction resistance elements) 61 and 63 are added to first switch unit 21 and resistance elements (correction resistance elements) 65 and 66 are added to second switch unit 22.

Resistance element 61 is connected between the drain electrode and gate electrode of FET 31, and resistance element 63 is connected between the drain electrode and gate electrode of FET 33.

Resistance element 65 is connected between first high-frequency terminal 1 and the gate electrode of FET 35, and resistance element 66 is connected between first high-frequency terminal 1 and the gate electrode of FET 36.

FIG. 25 shows an example of the second configuration of the switch circuit of the seventh exemplary embodiment.

The switch circuit shown in FIG. 25 is a configuration in which, to first switch unit 21 and second switch unit 22 provided in the SPDT switch circuit of the background art shown in FIG. 1, resistance elements 61-63 are added to first switch unit 21 and resistance elements 65 and 66 are added to second switch unit 22.

Resistance element 61 is connected between first high-frequency terminal 1 and the gate electrode of FET 31, resistance element 62 is connected between first high-frequency terminal 1 and the gate electrode of FET 32, and resistance element 63 is connected between the drain electrode and gate electrode of FET 33.

In addition, resistance element 65 is connected between first high-frequency terminal 1 and the gate electrode of FET 35, and resistance element 66 is connected between the drain electrode and gate electrode of FET 36.

FIG. 26 shows an example of a third configuration of the switch circuit of the seventh exemplary embodiment.

The switch circuit shown in FIG. 26 is a configuration in which, to first switch unit 21 and second switch unit 22 provided in the SPDT switch circuit of the background art shown in FIG. 1, resistance elements 61-63 and capacitance element 71 are added to first switch unit 21 and resistance elements 65 and 66 and capacitance element 75 are added to second switch unit 22.

Capacitance element 71 and resistance element 61 connected in a series are connected between first high-frequency terminal 1 and the gate electrode of FET 31, capacitance element 62 is connected between the drain electrode and gate electrode of FET 32, and resistance element 63 is connected between the drain electrode and gate electrode of FET 33.

Still further, capacitance element 75 and resistance element 65 that are connected in a series are connected between first high-frequency terminal 1 and the gate electrode of FET 35, and resistance element 66 is connected between the drain electrode and gate electrode of FET 36.

The example of the first configuration of the seventh exemplary embodiment is a configuration in which resistance element 62 is omitted from first switch unit 21 that was shown in the example of the first configuration of the sixth exemplary embodiment and resistance element 64 is omitted from second switch unit 22 shown in the example of the first configuration of the fifth exemplary embodiment.

The use of the switch circuit of the above-described fifth exemplary embodiment or sixth exemplary embodiment is most efficacious for reducing the even-order distortion that originates in resistance elements 41-46 provided in the switch circuit.

However, in uses in which the need to reduce even-order distortion is not great, a configuration in which a portion of the elements is deleted from the switch circuit of the fifth exemplary embodiment or sixth exemplary embodiment as shown in FIG. 24 can provide a greater reduction of even-order distortion than the switch circuit of the background art.

The example of the second configuration shown in FIG. 25 is a configuration in which: the first switch unit is a configuration in which the example of the first configuration of the fifth exemplary embodiment and the example of the first configuration of the sixth exemplary embodiment are combined, and the second switch unit is a configuration in which resistance element 64 has been deleted from a configuration in which the example of the first configuration of the fifth exemplary embodiment and the example of the first configuration of the sixth exemplary embodiment are combined.

As with the example of the first configuration, the example of the second configuration of the seventh exemplary embodiment shown in FIG. 25 can be employed for uses in which the need to reduce even-order distortion is not great and can provide a greater reduction of even-order distortion than the switch circuit of the background art.

The example of the third configuration of the seventh exemplary embodiment shown in FIG. 26 is a configuration in which: the first switch unit is a configuration in which the example of the first configuration and the example of the second configuration of the sixth exemplary embodiment are combined; and the second switch unit is a configuration in which resistance element 64 is deleted from a configuration in which the example of the second configuration of the fifth exemplary embodiment and the example of the first configuration of the sixth exemplary embodiment are combined.

The example of the third configuration of the seventh exemplary embodiment shown in FIG. 24 is a configuration in which, of resistance elements 61-66 of the example of the first configuration shown in FIG. 24 or the example of the second configuration shown in FIG. 25, capacitance element 71 is connected in a series to resistance element 61 and capacitance element 75 is connected in a series to resistance element 65. This configuration can also realize a greater reduction of even-order distortion than the switch circuit of the background art, and similar to the switch circuit of the fifth exemplary embodiment or sixth exemplary embodiment, can block direct-current current that flows between control terminals 11 and 12.

As explained in the foregoing description, the examples of the first, second, and third configurations of the fifth exemplary embodiment as well as the examples of the first and second configurations of the sixth exemplary embodiment allow the use of combinations.

The seventh exemplary embodiment is further not limited to each of the examples of the configurations shown in FIGS. 24-26. In other words, the seventh exemplary embodiment includes configurations in which the examples of configurations shown in the fifth exemplary embodiment are combined with the examples of the configurations shown in the sixth exemplary embodiment, or in which a portion of the elements provided in these configurations has been deleted.

Although explanation of the seventh exemplary embodiment regarded an example of an SPDT switch circuit, the configuration of the seventh exemplary embodiment is not limited to an SPDT switch circuit and may be applied to an nPmT switch provided with n-port input and m-port output. Still further, although explanation in the seventh exemplary embodiment regarded an example of a configuration in which first switch unit 21 and second switch unit 22 were each provided with three FETs 31-36 connected in a series, a configuration is also possible in which first switch unit 21 and second switch unit 22 are each provided with no more than two FETs connected in a series or with four or more FETs connected in a series.

Although an example of a configuration in which the first switch unit and second switch unit differed was shown in the seventh exemplary embodiment, the first switch unit and second switch unit may be of the same or different configuration.

In the seventh exemplary embodiment, the greatest reduction of the even-order distortion can be achieved when the values of resistance elements 61-66 and the values of resistance elements 41-46 shown in FIGS. 24-26 are equal as in the fifth exemplary embodiment or sixth exemplary embodiment. However, the values of resistance elements 61-66 and resistance elements 41-46 can be considered one design parameter that is set as appropriate according to the permissible even-order distortion of the device provided with the switch circuit of the present exemplary embodiment, and the values of resistance elements 61-66 and the values of resistance elements 41-46 need not be made equal.

In addition, the values of capacitance elements 71 and 75 shown in FIG. 26 should be sufficiently low compared to the impedance of resistance elements 41-46 to a high-frequency signal, and the values of capacitance elements 71 and 75 can also be considered one design parameter. In addition, other elements such as diodes or FETs may also be used in place of capacitance elements 71 and 75 if they can block direct-current current.

Eighth Exemplary Embodiment

Figure 27:
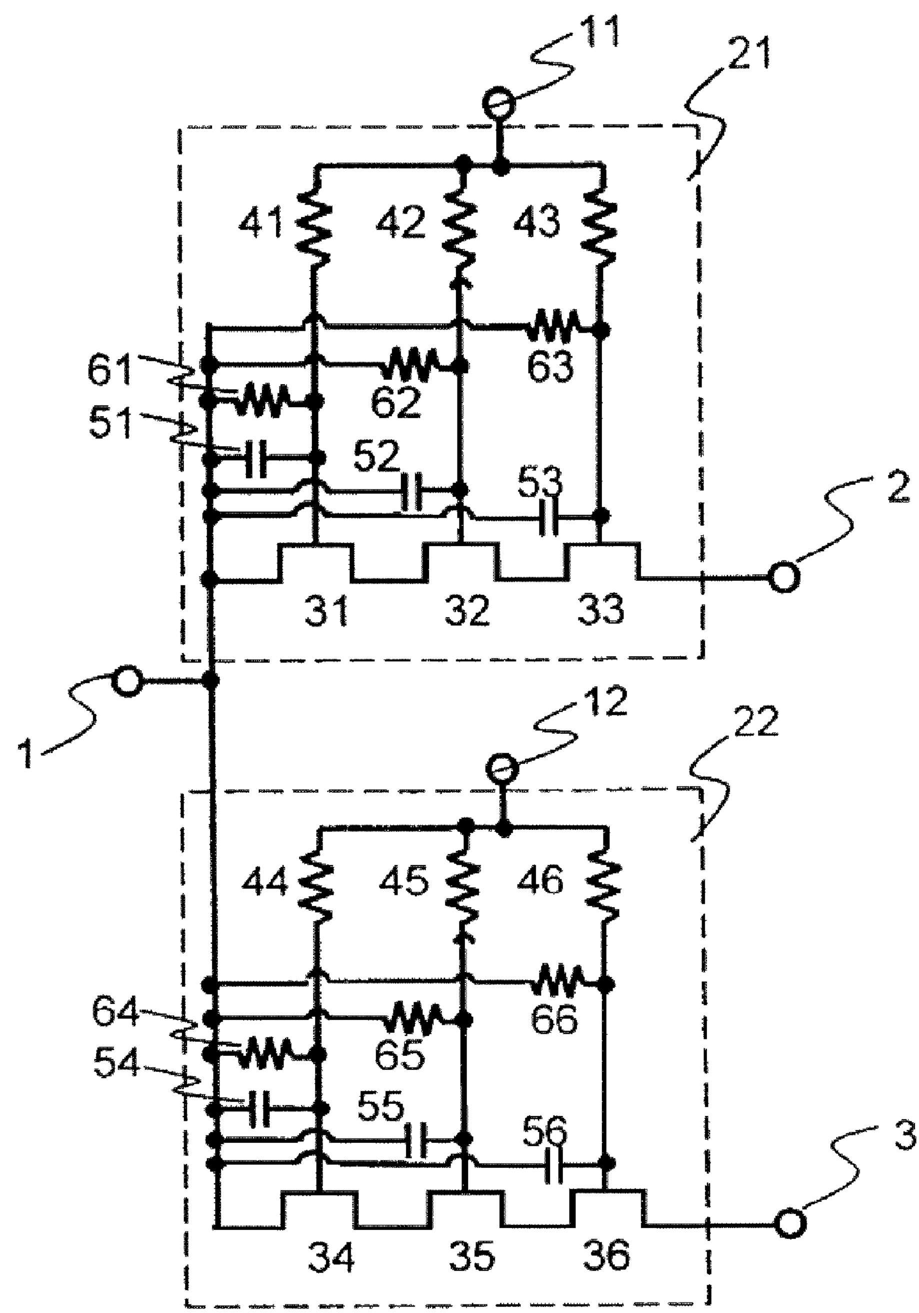
FIG. 27 is a circuit diagram showing an example of a first configuration of the switch circuit of the eighth exemplary embodiment.
Figure 28:
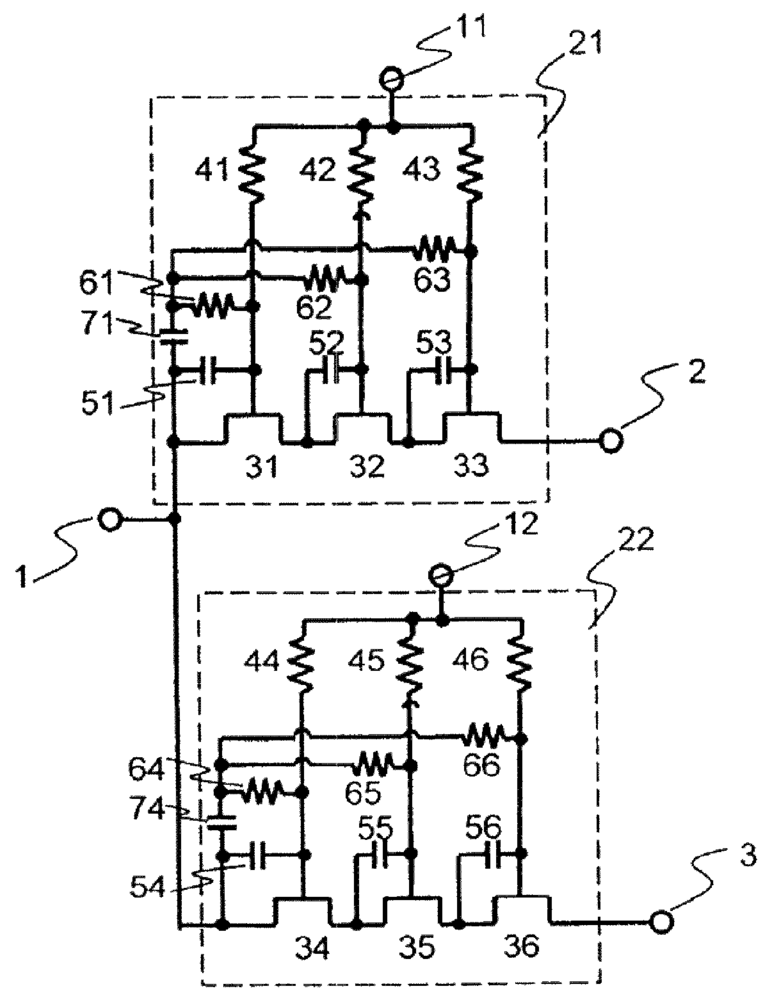
FIG. 28 is a circuit diagram showing an example of a second configuration of the switch circuit of the eighth exemplary embodiment.

FIGS. 27 and 28 are circuit diagrams showing examples of the configuration of the switch circuit of the eighth exemplary embodiment. FIGS. 27 and 28 are examples of applying the configuration of the present exemplary embodiment to an SPDT switch circuit.

FIG. 27 is an example in which the first exemplary embodiment and the example of the first configuration of the fifth exemplary embodiment are combined in first switch unit 21 and second switch unit 22 provided in the SPDT switch circuit of the background art shown in FIG. 1.

FIG. 28 is an example in which the second exemplary embodiment and the example of the third configuration of the fifth exemplary embodiment are combined in first switch unit 21 and second switch unit 22 provided in the SPDT switch circuit of the background art shown in FIG. 1.

The above-described first to fourth exemplary embodiments are configurations in which the asymmetry of impedance resulting from the ground parasitic capacitances that exist between the ground potential and the gate electrodes of FETs is corrected by capacitance elements 51-56, and the fifth to seventh exemplary embodiments are configuration in which the asymmetry of impedance resulting from resistance elements 41-46 connected between control terminals and the gate electrodes of FETs is corrected by resistance elements (correction resistance elements) 61-66.

Although the effect of reducing even-order distortion can be obtained if the asymmetry of the impedance provided in these switch circuit is corrected by only either one of capacitance elements 51-56 and resistance elements 61-66, the use of both capacitance elements 51-56 and resistance elements 61-66 can obtain a further reduction of even-order distortion.

The switch circuit of the eighth exemplary embodiment is a configuration that combines the above-described first to fourth exemplary embodiments and the fifth to seventh exemplary embodiments.

In the eighth exemplary embodiment, only the configuration shown by way of example in FIGS. 27 and 28 is shown, but the switch circuit of the eighth exemplary embodiment is assumed to include all combinations of the configurations shown by way of example in the first to fourth exemplary embodiments and the configuration shown by way of example in the fifth to seventh exemplary embodiments. Still further, the switch circuit of the eighth exemplary embodiment may employ the switch unit of the background art shown in FIG. 1 in either one of first switch unit 21 and second switch unit 22, as in the first to fourth exemplary embodiments.

The results of evaluating the switch circuit of the above-described second exemplary embodiment are next shown.

Figure 29:
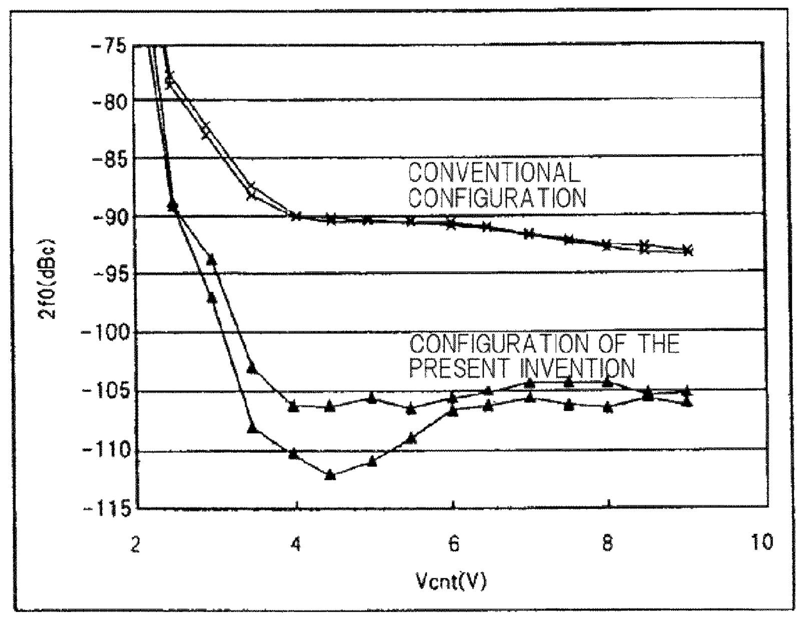
FIG. 29 is a graph showing the evaluation results of the second exemplary embodiment of the switch circuit of the present invention.

Characteristic 206 of FIG. 29 shows the change in $2f_0$ distortion with respect to the control voltage of the switch circuit of the background art shown in FIG. 1, and characteristic 207 of FIG. 29 shows the change in $2f_0$ distortion with respect to the control voltage of the switch circuit shown in FIG. 4. The control voltage is a signal for turning ON or OFF first switch unit 21 and second switch unit 22 that receive input from control terminals 11 and 12 of the switch circuit. Characteristic 206 and characteristic 207 shown in FIG. 29 show the change with respect to the control voltage of $2f_0$ that is the even-order distortion that occurs in each of first switch unit 21 and second switch unit 22. In other words, characteristic 206 and characteristic 207 are each noted as two lines in FIG. 29 because second switch unit 22 is turned OFF when the characteristic of first switch unit 21 is measured and first switch unit 21 is turned OFF when the characteristic of second switch unit 22 is measured.

As shown in FIG. 29, the $2f_0$ distortion in the switch circuit of the second exemplary embodiment exhibits an improvement of approximately 15 dB compared to the switch circuit of the background art, and the configurations proposed in the first to fourth exemplary embodiments can therefore be seen as effective in reducing even-order distortion.

Explanation next regards working examples of the switch circuits of the above-described first to eighth exemplary embodiments with reference to the accompanying drawings.

As described hereinabove, the drains and sources of FETs provided in a switch circuit are of the same construction and are therefore not generally distinguished. However, for the sake of convenience, the drains and sources of FETs are distinguished to clarify the connection relations of each element provided in the switch circuit. More specifically, the terminal arranged on the left side of a figure is assumed to be the source, and the terminal arranged on the right side of a figure is assumed to be the drain. The switch circuits shown in each of the following working examples can also be used by switching the relation of the drains and sources.

First Working Example

Figure 30:
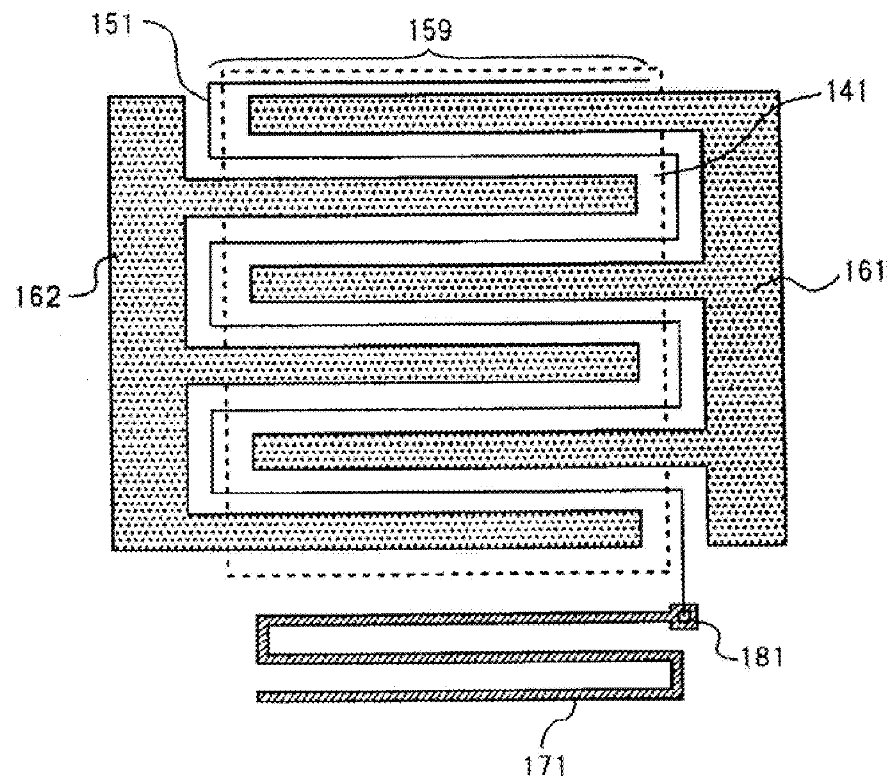
FIG. 30 is a plan view showing the construction of an FET provided in the switch circuit of a first working example.

FIG. 30 is a plan view showing the construction of an FET provided in the switch circuit of the first working example.

As shown in FIG. 30, the FET is of a configuration in which drain 161, source 162, and gate electrode 151 are formed on conductive channel 141. Resistance element 171 is connected to gate electrode 151 by way of through-hole 181.

In the switch circuit of the first working example, gate electrode 151 is formed to extend, this extension 159 being arranged parallel (adjacent) to the upper end of drain 161. The presence or absence of conductive channel 141 that is formed below extension 159 does not affect the characteristic of the switch circuit of the present working example, and conductive channel 141 may therefore be present or absent below extension 159.

In the switch circuit of the first working example, extension 159 is arranged parallel to the upper end of drain 161, but source 162 is not present at a confronting position with extension 159 interposed. As a result, extension 159 does not contribute to an increase of the gate width of the FET and does not change, for example, the direct-current current that flows between the drain and source. However, the arrangement of extension 159 parallel (adjacent) to drain 161 results in an increase in drain-gate capacitance Cgd due to the parasitic capacitance between extension 159 and drain 161, whereby the construction shown in FIG. 30 can realize the capacitance elements 51-56 shown in the first to fourth exemplary embodiments. The realization of capacitance elements 51-56 by means of the parasitic capacitance enables a limitation of the layout area of capacitance elements 51-56.

Second Working Example

Figure 31:
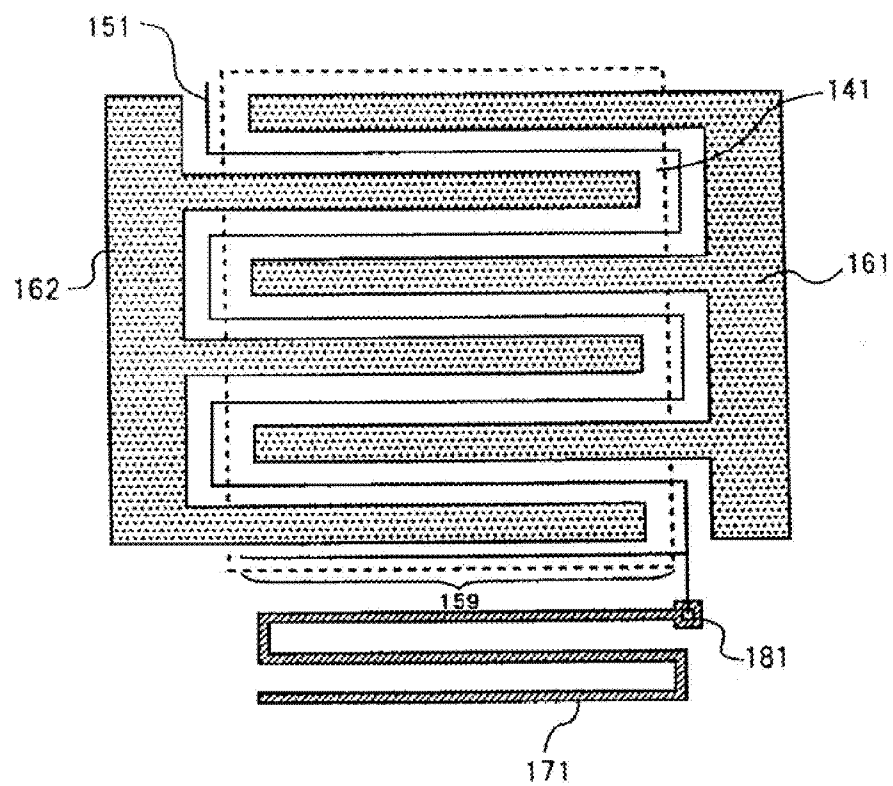
FIG. 31 is a plan view showing the construction of an FET provided in the switch circuit of a second working example.

FIG. 31 is a plan view showing the construction of an FET provided in the switch circuit of the second working example.

The switch circuit of the second working example is a modification of the switch circuit of the first working example.

In the switch circuit of the second working example, gate electrode 151 is formed to extend, this extension 159 being arranged parallel (adjacent) to the lower end of source 162. The presence or absence of conductive channel 141 that is formed below extension 159 does not affect the characteristic of the switch circuit of the present working example, and conductive channel 141 may therefore be present or absent below extension 159.

In the switch circuit of the second working example, extension 159 is arranged parallel to the lower end of source 162, but drain 161 is not present at a confronting position with extension 159 interposed. As a result, extension 159 does not contribute to an increase of the gate width of the FET and does not change, for example, the direct-current current that flows between the drain and source. However, the arrangement of extension 159 parallel to source 162 results in an increase of the source-gate capacitance Cgs due to the parasitic capacitance between extension 159 and source 162, and the construction shown in FIG. 31 can therefore realize capacitance elements 51-56 shown in the first to fourth exemplary embodiments. In addition, the realization of capacitance elements 51-56 by means of parasitic capacitance can further limit the layout area of capacitance elements 51-56.

Third Working Example

Figure 32:
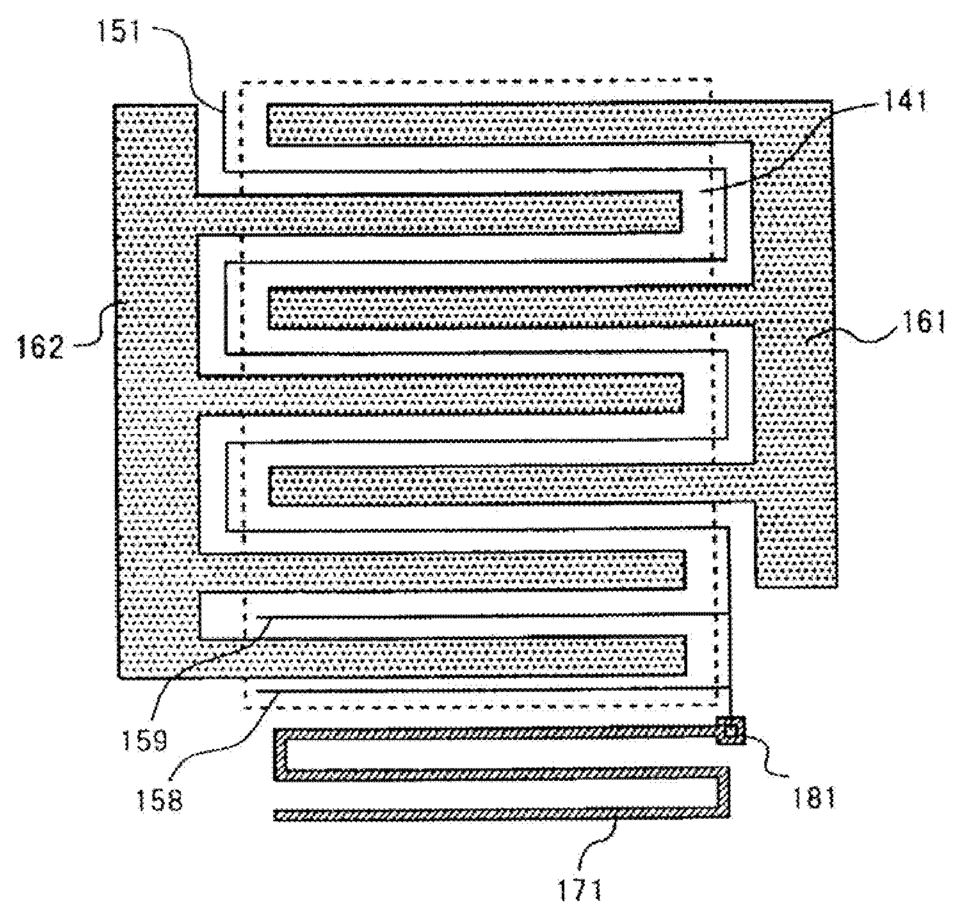
FIG. 32 is a plan view showing another construction of an FET provided in the switch circuit of a third working example.

FIG. 32 is a plan view showing the construction of an FET provided in the switch circuit of the third working example.

The switch circuit of the third working example is a modification of the switch circuit of the second working example.

The switch circuit of the third working example is a configuration in which gate electrode 151 is formed to extend, these extensions 158 and 159 being arranged parallel (adjacent) to the lower end of source 162. The presence or absence of conductive channel 141 that is formed below extensions 158 and 159 does not affect the characteristics of the switch circuit of the present working example, and conductive channel 141 may therefore be present or absent below extensions 158 and 159.

In the switch circuit of the third working example, extension 158 is arranged interposed between two sources 162 and extension 159 is arranged parallel to the lower end of source 162, but because there is no drain 161 at confronting positions with extensions 158 and 159 interposed, extension 159 does not contribute to increase in the gate width of the FET and does not change, for example, the direct-current current that flows between the drain and source.

However, the arrangement of extensions 158 and 159 parallel to source 162 results in an increase of the source-gate capacitance Cgs caused by the parasitic capacitance between source 162 and extensions 158 and 159, and capacitance elements 51-56 shown in the first to fourth exemplary embodiments can therefore be realized by the construction shown in FIG. 29. In addition, the realization of capacitance elements 51-56 by means of parasitic capacitance enables a limitation of the layout area of capacitance elements 51-56.

When the necessary capacitance for capacitance elements 51-56 is not realized by one extension, two or more extensions may be arranged as in the present working example. In addition, when conductive channel 141 is present below extensions 158 and 159, conductive channel 141 and extensions 158 and 159 form source-gate capacitance Cgs, and source 162 therefore need not be arranged between extension 158 and extension 159 if the necessary capacitance can be secured.

The construction of the present working example obtains the same effect when applied to the switch circuit of the first working example.

Fourth Working Example

Figure 33:
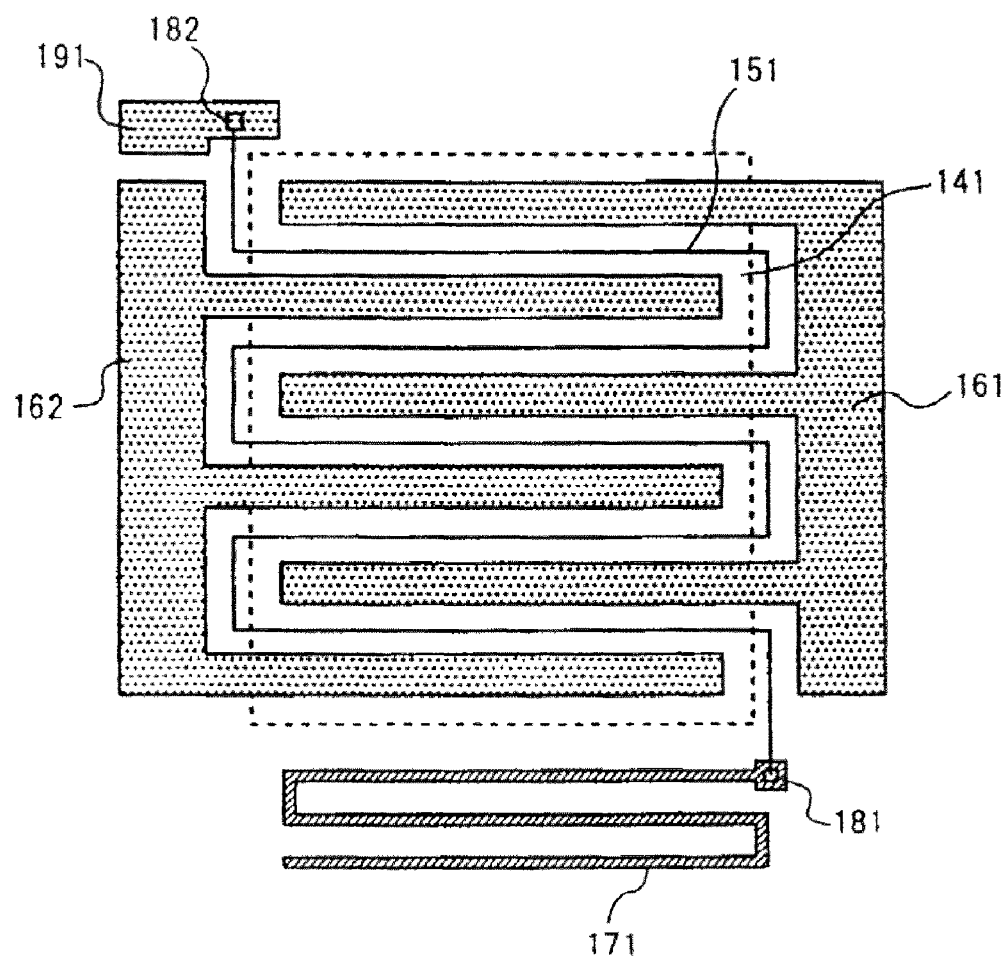
FIG. 33 is a plan view showing the construction of an FET provided in the switch circuit of a fourth working example.

FIG. 33 is a plan view showing the construction of the FET provided in the switch circuit of the fourth working example.

As shown in FIG. 33, the switch circuit of the fourth working example is a configuration in which interconnect 191 connects to gate electrode 151 via through-hole 182.

In the switch circuit of the fourth working example, interconnect 191 is arranged parallel (adjacent) to source 162, and this construction is therefore equivalent to a configuration in which a capacitance element is connected between the gate and source due to the parasitic capacitance between interconnect 191 and source 162.

In FIG. 33, interconnect 191 is arranged parallel to source 162, but arrangement parallel to an interconnect that is connected to first high-frequency terminal 1 can realize capacitance elements 51-56 shown in the first to fourth exemplary embodiments by a construction similar to FIG. 33. In addition, realizing capacitance elements 51-56 by means of parasitic capacitance enables a limitation of the layout area of capacitance elements 51-56.

Fifth Working Example

Figure 34:
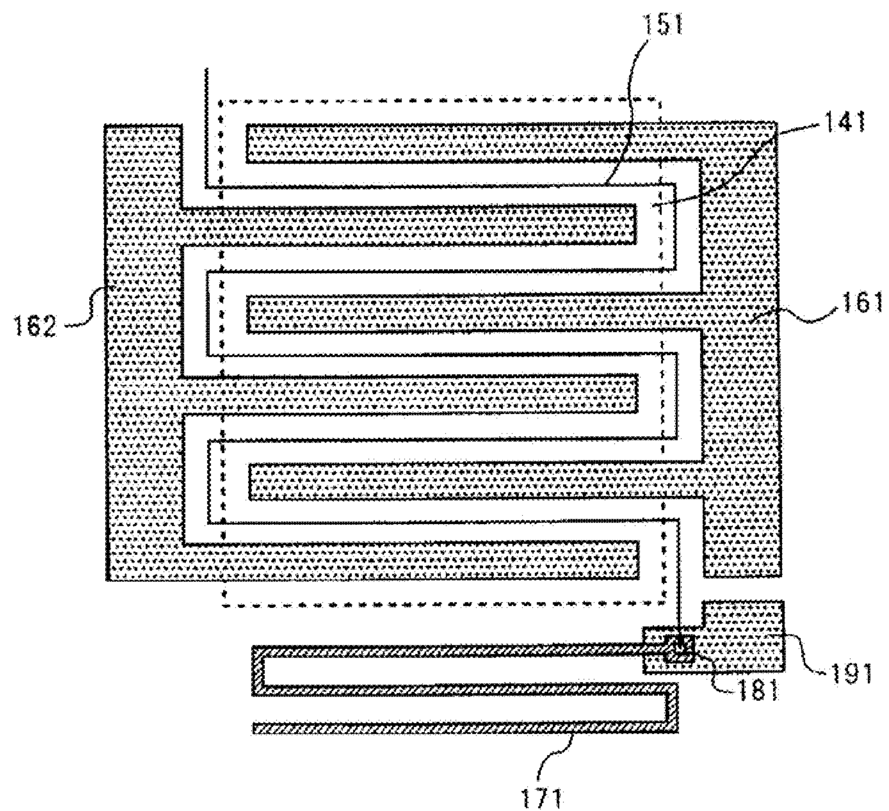
FIG. 34 is a plan view showing the construction of an FET provided in the switch circuit of a fifth working example.

FIG. 34 is a plan view showing the construction of an FET provided in the switch circuit of the fifth working example.

The switch circuit of the fifth working example is a modification of the switch circuit of the fourth working example.

As shown in FIG. 34, the switch circuit of the fifth working example is a configuration in which interconnect 191 is connected to gate electrode 151 by way of through-hole 182, as with the switch circuit of the fourth working example.

In the switch circuit of the fifth working example, interconnect 191 is arranged parallel (adjacent) to drain 161 and this construction is therefore equivalent to a configuration in which a capacitance element is connected between the drain and gate due to the parasitic capacitance between drain 161 and interconnect 191.

In FIG. 34, interconnect 191 is arranged parallel to drain 161, but arrangement parallel to an interconnect that is connected to first high-frequency terminal 1 can realize capacitance elements 51-56 shown in the first to fourth exemplary embodiments by the same construction as FIG. 34. Realizing capacitance elements 51-56 by means of parasitic capacitance further enables a limitation of the layout area of capacitance elements 51-56.

Sixth Working Example

Figure 35:
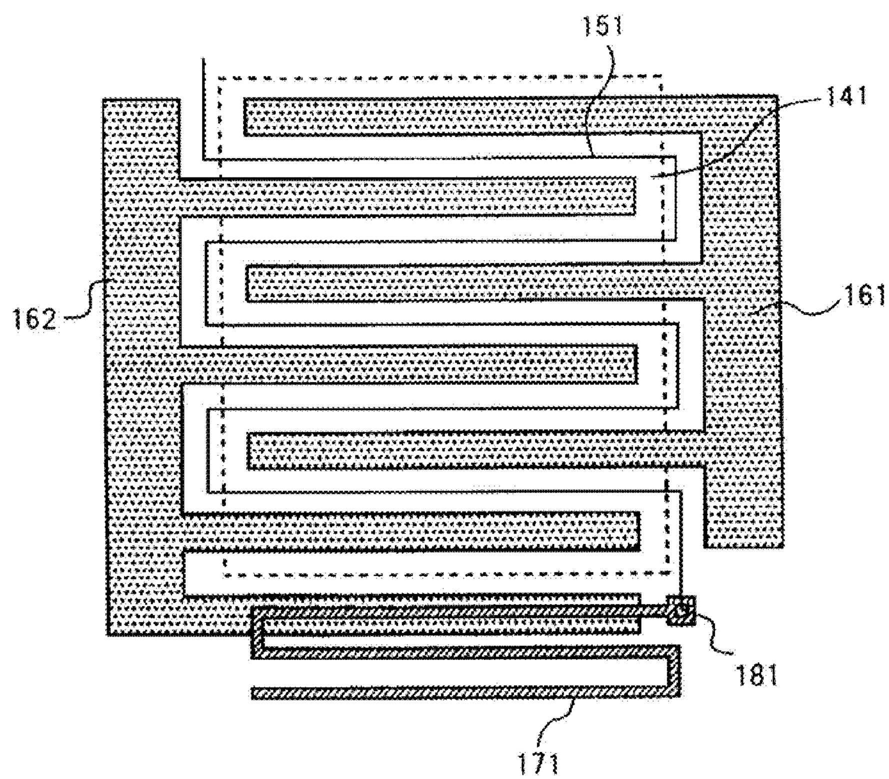
FIG. 35 is a plan view showing the construction of an FET provided in the switch circuit of a sixth working example.
Figure 36:
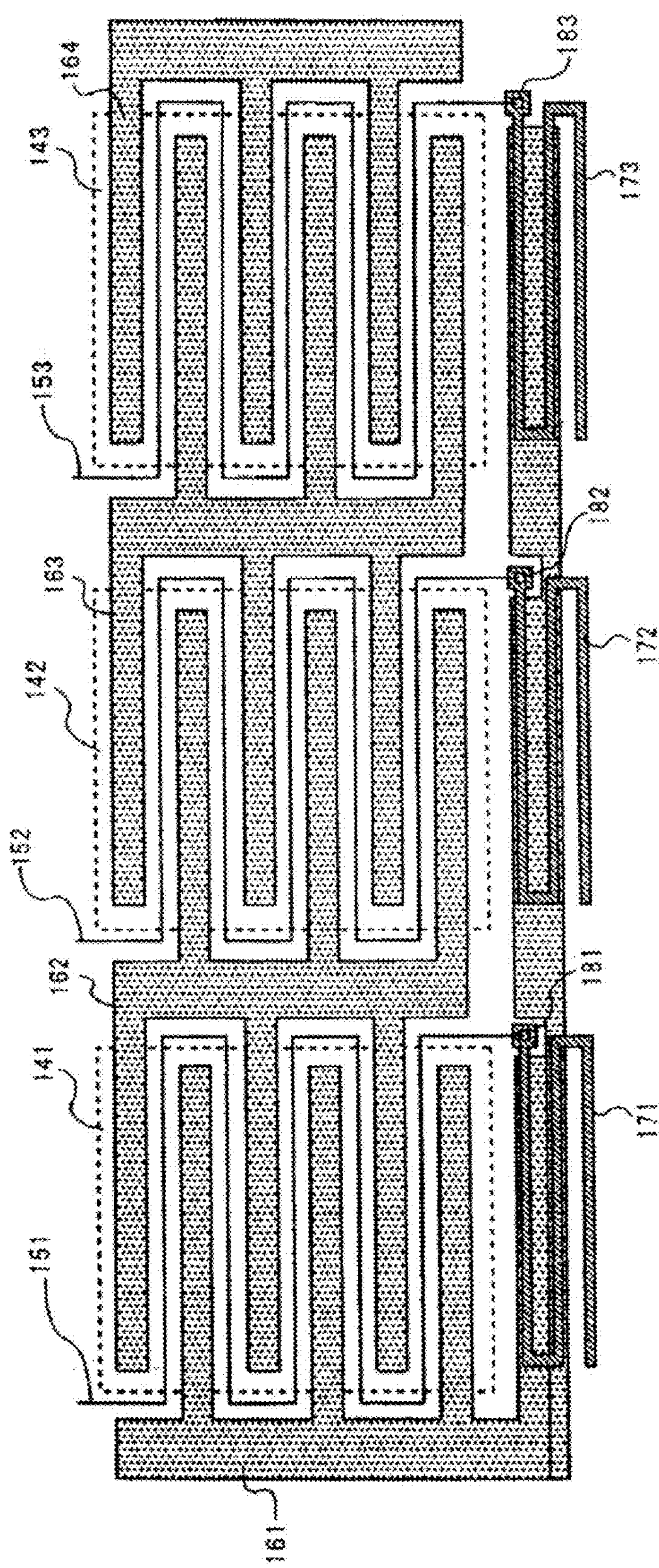
FIG. 36 is a plan view showing the construction of FETs provided in the switch circuit of the sixth working example.

FIGS. 35 and 36 are plan views showing the construction of FETs provided in the switch circuit of the sixth working example. FIG. 36 shows an example of the construction of a switch circuit of the first exemplary embodiment shown in FIG. 1.

As shown in FIG. 35, the switch circuit of the sixth working example is a configuration in which source 162 is formed on resistance element 171 that is connected to gate electrode 151 with an insulating film interposed between source 162 and resistance element 171.

FIG. 36 shows an example of a configuration in which FETs shown in FIG. 35 are connected in a series. In other words, a first FET is a configuration in which drain 161, source 162, and gate electrode 151 are formed on conductive channel 141, and resistance element 171 is connected to gate electrode 151 by way of through-hole 181.

A second FET is a configuration in which drain 162, source 163, and gate electrode 152 are formed on conductive channel 142, and resistance element 172 is connected to gate electrode 152 by way of through-hole 182.

A third FET is a configuration in which drain 163, source 164, and gate electrode 153 are formed on conductive channel 1413, and resistance element 173 is connected to gate electrode 153 by way of through-hole 183.

The source of the first FET and the drain of the second FET are shared, and the source of the second FET and the drain of the third FET are shared. The source of the first FET is arranged on resistance elements 171, 172, and 173 with an insulating film interposed.

In this configuration, the arrangement of the source of the FET over the resistance elements is equivalent to a configuration in which capacitance elements are connected between the gate and source due to the parasitic capacitance between the resistance elements and the source.

Accordingly, the construction shown in FIG. 35 can realize capacitance elements 51-56 shown in the first to fourth exemplary embodiments. Realizing capacitance elements 51-56 by means of parasitic capacitance enables a limitation of the layout area of capacitance elements 51-56.

Although examples of configurations were shown in the first to sixth working examples in which one FET or three FETs were connected in a series, the number of FETs is not limited to this number, and may be any number. The FETs shown in the first to sixth working examples can also be used in nPmT switches provided with n-port input and m-port output.

In the first to sixth working examples, an example of construction is shown in which conductive channel 141 is not arranged below the turning portions of the gate electrode to prevent any effect of the flow of current between source and drain in these turning portions. However, this construction is not related to the effect of the present invention, and the present invention can therefore also use a construction in which conductive channel 141 is arranged below the turning portions of the gate electrode.

Although explanation in the first to sixth working examples regards examples in which the parasitic capacitance between lines is used to realize capacitance elements 51-56, the same effect as the first to fourth exemplary embodiments can be obtained in a configuration that connects capacitance elements 51-56 that are realized by a different construction.

The invention of the present application has been explained hereinabove with reference to the exemplary embodiments, but the invention of the present application is not limited to the above-described exemplary embodiments. The configuration and details of the invention of the present application are open to various modifications within the scope of the present application that will be readily understood by one expert in the art.

This application declares priority based on Japanese Patent Application No. 2007-212262 for which application was submitted on Aug. 16, 2007 and incorporates all of the disclosures of that application.

The invention claimed is:

1. A switch circuit for passing or blocking a high-frequency signal, comprising a correction circuit for correcting impedance that is present between ground and any terminal in the switch circuit and that changes asymmetrically with the direct-current potential of said high-frequency signal as reference, such that impedance seen from either of high-frequency terminals changes symmetrically with said direct-current potential as reference in response to positive and negative change that takes said direct-current potential as reference.

2. The switch circuit according to claim 1, wherein:

impedance that changes asymmetrically with said direct-current potential as a reference is impedance of ground parasitic capacitance; and said correction circuit includes a correction capacitance element for balancing the impedance of said ground parasitic capacitance.

3. The switch circuit according to claim 2, further comprising:

a switch unit provided with: a first high-frequency terminal and a second high-frequency terminal that receive and supply said high-frequency signals, and a plurality of field-effect transistors connected in a series between said first high-frequency terminal and said second high-frequency terminal;

wherein said ground parasitic capacitance is parasitic capacitance between the ground potential and the gate electrodes of said field-effect transistors.

4. The switch circuit according to claim 3, wherein said correction circuit is connected between said first high-frequency terminal and the gate electrode of at least one field-effect transistor that is connected in a series.

5. The switch circuit according to claim 3, wherein said correction circuit is connected between the gate electrode of at least one field-effect transistor that is connected in a series and the drain of that field-effect transistor.

6. The switch circuit according to claim 1, further comprising a switch unit provided with: a first high-frequency terminal and a second high-frequency terminal that receive and supply said high-frequency signal, a plurality of field-effect transistors connected in a series between said first high-frequency terminal and said second high-frequency terminal, and resistance elements connected between a control terminal and the gate electrodes of said field-effect transistors; wherein:

the impedance that changes asymmetrically with said direct-current potential as a reference is the impedance of resistance elements connected between said control terminal and the gate electrodes of said field-effect transistors; and said correction circuit includes correction resistance elements for balancing impedance with the impedance of said resistance elements.

7. The switch circuit according to claim 6, wherein said correction circuit is capacitance elements and resistance elements for correction connected in a series.

8. The switch circuit according to claim 6, wherein the value of resistance elements connected between said control terminal and the gate electrodes of said field-effect transistors is equal to the value of said correction resistance elements.

9. The switch circuit according to claim 6, wherein said correction circuit is connected between the gate electrode of at least one field-effect transistor that is connected in a series and said first high-frequency terminal.

10. The switch circuit according to claim 6, wherein said correction circuit is connected between the gate electrode of at least one field-effect transistor that is connected in a series and the drain of that field-effect transistor.

11. The switch circuit according to claim 1, further comprising a switch unit provided with: a first high-frequency terminal and a second high-frequency terminal that receive and supply said high-frequency signal, a plurality of field-effect transistors connected in a series between said first high-frequency terminal and said second high-frequency terminal, and resistance elements connected between a control terminal and the gate electrodes of said field-effect transistors; wherein:

the impedance that changes asymmetrically with said direct-current potential as a reference is the impedance of the ground parasitic capacitance between the ground potential and the gate electrodes of said field effect transistors and the impedance of the resistance elements connected between said control terminal and the gate electrodes of said field-effect transistors;

said correction circuit includes:

correction capacitance elements for balancing impedance with the impedance of said ground parasitic capacitance between the ground potential and the gate electrodes of said field-effect transistors; and correction resistance elements for balancing impedance with the impedance of the resistance elements connected between said control terminal and the gate electrodes of said field-effect transistors; and said correction circuit is connected between said first high-frequency terminal and the gate electrode of at least one field-effect transistor that is connected in a series.

12. The switch circuit according to claim 1, further comprising a switch unit provided with: a first high-frequency terminal and a second high-frequency terminal that receive and supply said high-frequency signal, a plurality of field-effect transistors connected in a series between said first high-frequency terminal and said second high-frequency terminal, and resistance elements connected between a control terminal and the gate electrodes of said field-effect transistors; wherein:

the impedance that changes asymmetrically with said direct-current potential as a reference is the impedance of the ground parasitic capacitance between the ground potential and the gate electrodes of said field effect transistors and the impedance of the resistance elements connected between said control terminal and the gate electrodes of said field-effect transistors;

said correction circuit includes:

correction capacitance elements for balancing impedance with the impedance of said ground parasitic capacitance between the ground potential and the gate electrodes of said field-effect transistors; and correction resistance elements for balancing impedance with the impedance of the resistance elements connected between said control terminal and the gate electrodes of said field-effect transistors; and said correction circuit is connected between the gate electrode of at least one field-effect transistor that is connected in a series and the drain of that field-effect transistor.

13. The switch circuit according to claim 4, including a plurality of switch units that share said first high-frequency terminal.

14. The switch circuit according to claim 3, wherein said capacitance elements are parasitic capacitance between said drain or source and an extension realized by an extension of the gate electrode arranged parallel to the end portion of the drain or the end portion of the source of a field-effect transistor.

15. The switch circuit according to claim 3, wherein said capacitance elements are parasitic capacitance between said drain or source and an interconnect that is arranged parallel to the end portion of the drain or the end portion of the source and that is connected to the gate electrode of a field-effect transistor.

16. The switch circuit according to claim 3, wherein said capacitance elements are parasitic capacitance between the resistance elements that are connected to the gate electrode of a field-effect transistor and the source that is formed with an insulating film interposed between the source and said resistance elements.

17. A semiconductor device provided with the switch circuit according to claim 1.

18. The switch circuit according to claim 5, including a plurality of switch units that share said first high-frequency terminal.

19. The switch circuit according to claim 9, including a plurality of switch units that share said first high-frequency terminal.

20. The switch circuit according to claim 10, including a plurality of switch units that share said first high-frequency terminal.

21. The switch circuit according to claim 11, including a plurality of switch units that share said first high-frequency terminal.

22. The switch circuit according to claim 12, including a plurality of switch units that share said first high-frequency terminal.

23. The switch circuit according to claim 11, wherein said capacitance elements are parasitic capacitance between said drain or source and an extension realized by an extension of the gate electrode arranged parallel to the end portion of the drain or the end portion of the source of a field-effect transistor.

24. The switch circuit according to claim 12, wherein said capacitance elements are parasitic capacitance between said drain or source and an extension realized by an extension of the gate electrode arranged parallel to the end portion of the drain or the end portion of the source of a field-effect transistor.

25. The switch circuit according to claim 11, wherein said capacitance elements are parasitic capacitance between said drain or source and an interconnect that is arranged parallel to the end portion of the drain or the end portion of the source and that is connected to the gate electrode of a field-effect transistor.

26. The switch circuit according to claim 12, wherein said capacitance elements are parasitic capacitance between said drain or source and an interconnect that is arranged parallel to the end portion of the drain or the end portion of the source and that is connected to the gate electrode of a field-effect transistor.

27. The switch circuit according to claim 11, wherein said capacitance elements are parasitic capacitance between the resistance elements that are connected to the gate electrode of a field-effect transistor and the source that is formed with an insulating film interposed between the source and said resistance elements.

28. The switch circuit according to claim 12, wherein said capacitance elements are parasitic capacitance between the resistance elements that are connected to the gate electrode of a field-effect transistor and the source that is formed with an insulating film interposed between the source and said resistance elements.

* * * * *